(12) United States Patent
Takeshima et al.

(10) Patent No.: US 7,898,792 B2
(45) Date of Patent: Mar. 1, 2011

(54) THIN-FILM CAPACITOR

(75) Inventors: Yutaka Takeshima, Nagaokakyo (JP);
Masanobu Nomura, Yasu (JP); Takeshi Inao, Konan (JP)

(73) Assignee: Murata Manufacturing Co., Ltd, Kyoto-fu (JP)

( * ) Notice: Subject to any disclaimer, the term of this patent is extended or adjusted under 35 U.S.C. 154(b) by 0 days.

(21) Appl. No.: 12/103,234

(22) Filed: Apr. 15, 2008

(65) Prior Publication Data

US 2008/0186654 A1   Aug. 7, 2008

Related U.S. Application Data

(63) Continuation of application No. PCT/JP2006/313940, filed on Jul. 13, 2006.

(30) Foreign Application Priority Data

Oct. 18, 2005  (JP) .................................. 2005-303143
May 15, 2006  (JP) .................................. 2006-135571

(51) Int. Cl.
*H01G 4/06* (2006.01)
*H01G 4/20* (2006.01)

(52) U.S. Cl. .......................................... 361/313; 361/311

(58) Field of Classification Search .................. 361/313, 361/308.1, 311, 307, 309, 310
See application file for complete search history.

(56) References Cited

U.S. PATENT DOCUMENTS

| | | | |
|---|---|---|---|
| 6,184,567 B1 * | 2/2001 | Fujisawa et al. | 257/532 |
| 6,226,170 B1 * | 5/2001 | Nellissen et al. | 361/306.1 |
| 6,475,860 B2 * | 11/2002 | Kwon et al. | 438/253 |
| 6,623,986 B2 * | 9/2003 | Ogata et al. | 438/3 |
| 6,897,503 B2 * | 5/2005 | Otani et al. | 257/295 |
| 6,963,483 B2 * | 11/2005 | Chakravorty et al. | 361/306.3 |
| 2002/0014644 A1 * | 2/2002 | Van Buskirk et al. | 257/295 |
| 2003/0109079 A1 | 6/2003 | Yamaguchi et al. | |
| 2004/0130849 A1 | 7/2004 | Kurihara et al. | |
| 2005/0056878 A1 * | 3/2005 | Shioga et al. | 257/300 |
| 2005/0146838 A1 * | 7/2005 | Shioga et al. | 361/306.3 |
| 2008/0134499 A1 * | 6/2008 | Shioga et al. | 29/830 |
| 2008/0257487 A1 * | 10/2008 | Shioga et al. | 156/249 |

FOREIGN PATENT DOCUMENTS

| | | |
|---|---|---|
| JP | 06-112083 | 4/1994 |
| JP | 11-097289 | 4/1999 |
| JP | 2002-033239 | 1/2002 |
| JP | 2002-260957 | 9/2002 |
| JP | 2002-299163 | 10/2002 |
| JP | 2003-174118 | 6/2003 |
| JP | 2004-207324 | 7/2004 |
| JP | 2004-214589 | 7/2004 |

* cited by examiner

*Primary Examiner* — Eric Thomas
*Assistant Examiner* — David M Sinclair
(74) *Attorney, Agent, or Firm* — Dickstein Shapiro LLP

(57) ABSTRACT

A thin-film capacitor and a method for making the thin-film capacitor having a structure that can prevent vertical stress acting on outer connecting terminals, such as bumps, from concentrating on electrode layers, and capable of easily increasing the equivalent series resistance to a desired value. The thin-film capacitor includes a substrate, a capacitor unit disposed above the substrate and composed of at least one dielectric thin film and two electrode layers, a protective layer covering at least part of the capacitor unit, a lead conductor electrically connected to one of the electrode layers of the capacitor unit, and a bump disposed above the lead conductor. The lead conductor includes a connecting part disposed in an opening in the protective layer and electrically connected to one of the electrode layers of the capacitor unit, and a wiring part extending over the protective layer. The bump is disposed above the wiring part.

14 Claims, 17 Drawing Sheets

FIG. 5
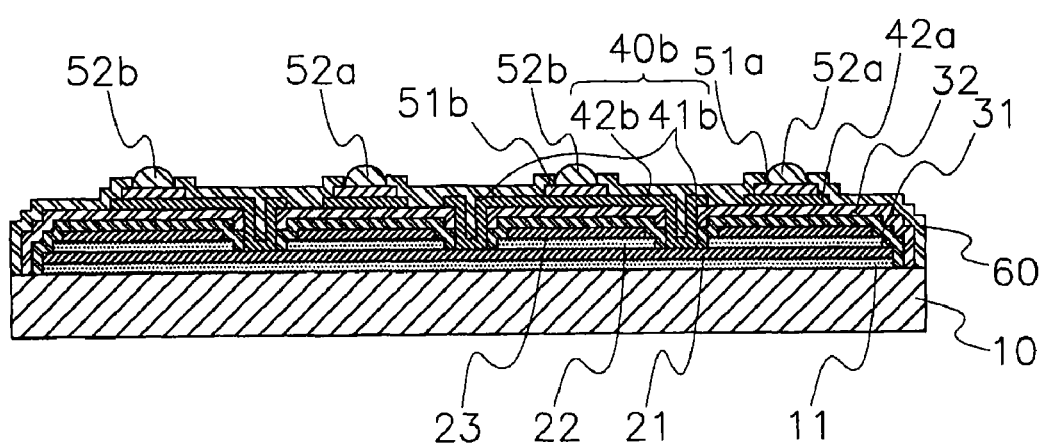
(a)
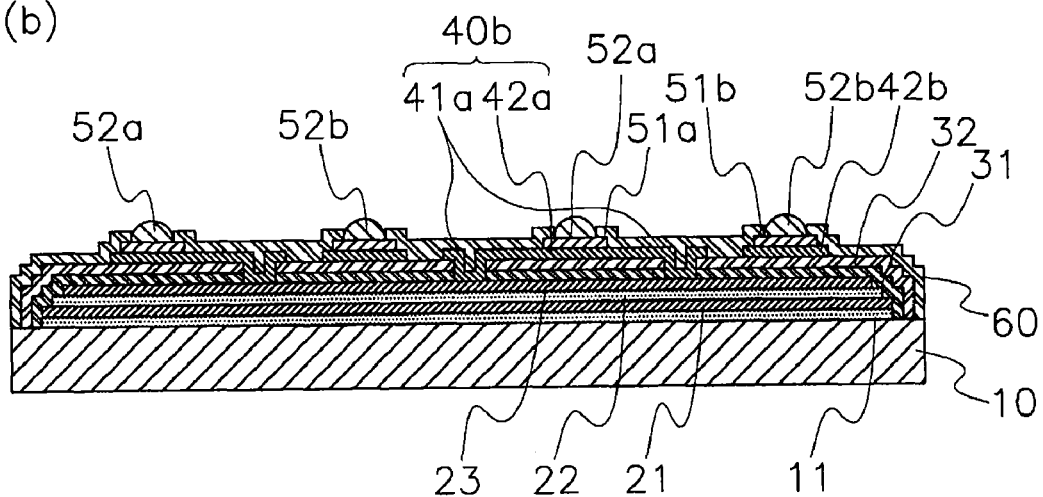
(b)

FIG. 13
(a)
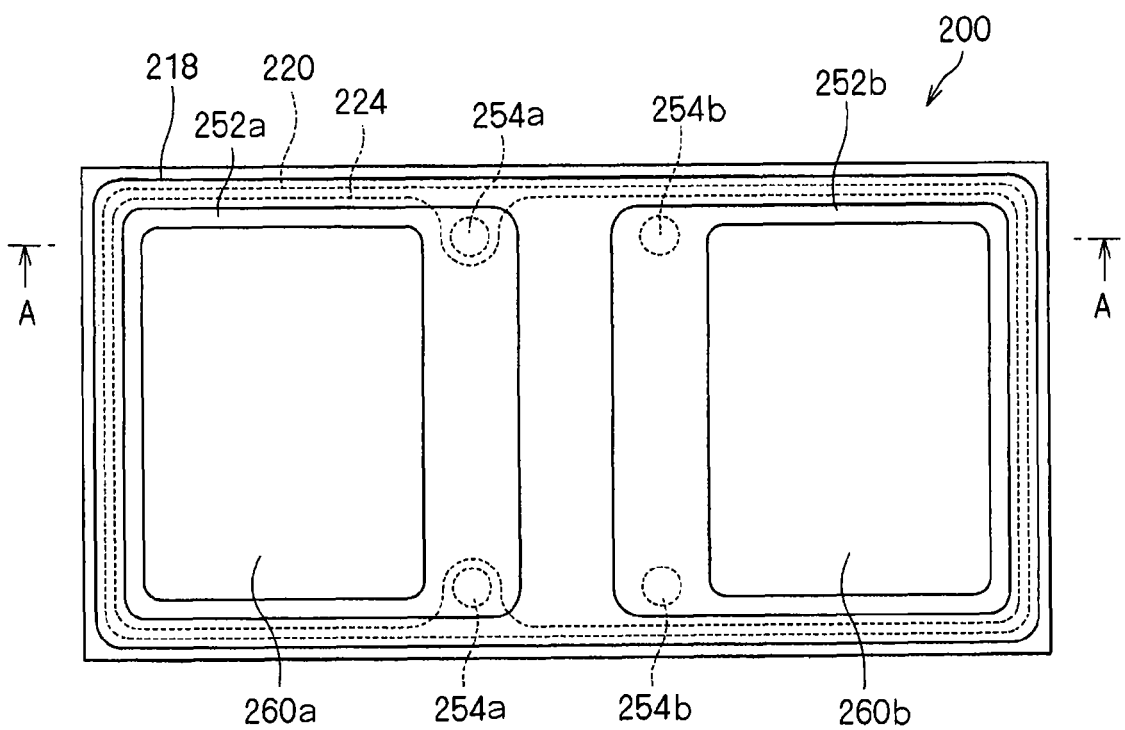
(b)
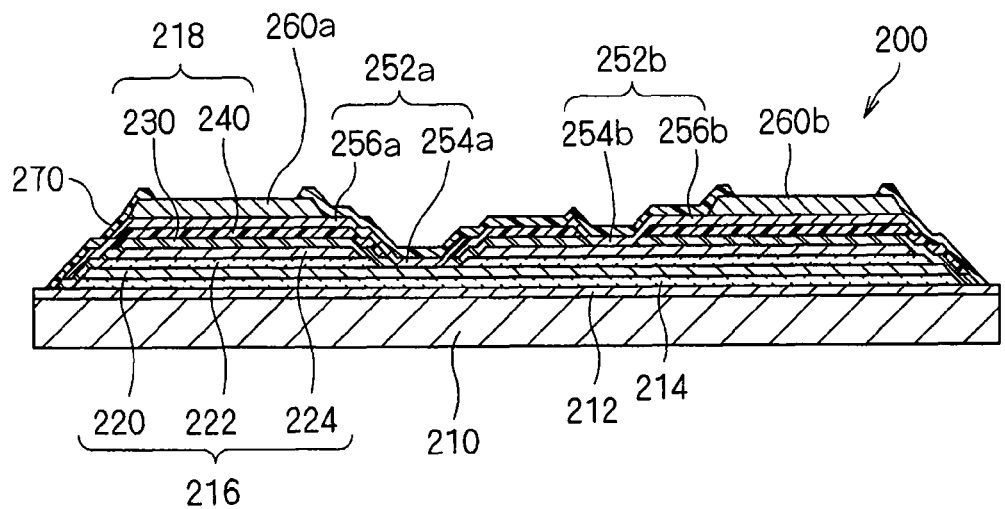

THIN-FILM CAPACITOR

CROSS REFERENCE TO RELATED APPLICATIONS

The present application is a continuation of International Application No. PCT/JP2006/313940, filed Jul. 13, 2006, which claims priority to Japanese Patent Application No. JP2005-303143, filed Oct. 18, 2005, and Japanese Patent Application No. JP2006-135571, filed May 15, 2006, the entire contents of each of these applications being incorporated herein by reference in their entirety.

FIELD OF THE INVENTION

The present invention relates to thin-film capacitors and particularly to thin-film capacitors used to decouple integrated circuits.

BACKGROUND OF THE INVENTION

With the increasing processing speed of large-scale integrated circuits (LSIs), decoupling capacitors have been increasingly used in recent years. To improve high-frequency tracking performance of a decoupling capacitor, it is necessary to reduce inductance between the decoupling capacitor and an LSI. For this purpose, the decoupling capacitor is directly disposed in the LSI, which is connected via bumps to the decoupling capacitor.

Examples of thin-film capacitors used for decoupling include a thin-film capacitor disclosed in Patent Document 1. The disclosed thin-film capacitor will be described with reference to FIG. 10.

A thin-film capacitor 100 includes a lower electrode 102, a dielectric thin film 103, and an upper electrode 104 that are disposed on a substrate 101 in this order. Contact pads 107a and 107b are connected to the lower electrode 102 and the upper electrode 104, respectively. Bumps 108a and 108b for making an electrical connection to an LSI, to a mounting board, and the like are disposed on the contact pads 107a and 107b, respectively. Additionally, a protective insulating layer 106 of resin material, such as polyimide, is provided for absorbing mechanical stress from the bumps 108a and 108b. A barrier layer 105 of nonconductive inorganic material is disposed between a capacitor unit (including the lower electrode 102, dielectric thin film 103, and upper electrode 104) and the protective insulating layer 106. The barrier layer 105 protects the dielectric thin film 103 from being adversely affected by hydrogen ions dissociated from $H_2O$ produced by a dehydration condensation reaction that occurs when polyimide is cured.

Patent Document 1: Japanese Unexamined Patent Application Publication No. 2004-214589

In the invention described in Patent Document 1, the protective insulating layer 106 is provided to absorb mechanical stress from the bumps 108a and 108b. The protective insulating layer 106 serves as a shock absorber which is effective, to some extent, against stress in the horizontal direction (which is parallel to the primary surface of the substrate 101 and is the lateral direction in the drawing) on the bumps 108a and 108b. However, the shock-absorbing effect of the protective insulating layer 106 against stress having a component in the vertical direction (which is perpendicular to the primary surface of the substrate 101 and is the longitudinal direction in the drawing) is not necessarily sufficient.

Here, there will be described a mechanism in which stress having a component in the vertical direction acts on the bumps 108a and 108b. A Si substrate typically used to form a thin-film capacitor has a coefficient of linear expansion of 2 to 3 ppm/° C. On the other hand, a resin multilayer substrate has a coefficient of linear expansion of several tens of ppm/° C., which is much greater than that of the Si substrate. Hence, when the thin-film capacitor is mounted on the resin multilayer substrate and a temperature change occurs, either of the Si substrate and the resin multilayer substrate warps due to the difference in coefficient of linear expansion between these substrates.

Whether the Si substrate or the resin substrate warps depends on the thicknesses and Young's moduli of these substrates. For example, in the case where the Si substrate is more easily deformed than the resin substrate, when the thin-film capacitor is mounted with solder bumps on the resin substrate and cooled, the resin substrate contracts to a greater degree than the Si substrate. Therefore, the thin-film capacitor is deformed such that its surface on which no bumps are formed is raised. This deformation causes large tensile stress to be generated in bumps located in the center of the thin-film capacitor. At the same time, this deformation causes shearing stress, which is stress in the direction along the surface of the Si substrate, to be generated in bumps located near the periphery of the thin-film capacitor. On the other hand, in the case where the resin substrate is more easily deformed than the Si substrate, the resin substrate is deformed, when cooled, such that its surface on which the thin-film capacitor is not mounted is depressed. This deformation causes large tensile stress to be generated in outer bumps.

Referring to FIG. 10, when tensile stress in the upward direction in the drawing is generated in the bump 108b, since the bonding strength of the interface between the bump 108b and the contact pad 107b and the bonding strength of the interface between the contact pad 107b and the upper electrode 104 are relatively strong, the upper electrode 104 is pulled upward. Similarly, when shearing stress is generated in the bump 108b, the upper electrode 104 is pulled in the lateral direction. At the same time, the bonding strength of the interface between the upper electrode 104 and the dielectric thin film 103 is relatively weak, because they are made of different materials (that is, the upper electrode 104 is made of metal, while the dielectric thin film 103 is an oxide). This causes separation in the interface between the upper electrode 104 and the dielectric thin film 103, leads to rupture of the upper electrode 104, and may significantly damage the functions of the capacitor. Even if the separation does not occur in the interface, large residual tensile stress in the interface adversely affects the reliability of the capacitor.

Substrate warpage, which causes such tensile stress, is particularly significant when lead-free solder having a high reflow temperature is used as a material of bumps. Since use of lead-free solder has increased in recent years because of environmental concerns, the above-described problems need to be addressed urgently.

Although, for illustrative purposes, there has been described the case where the thin-film capacitor is mounted on the resin substrate, similar problems arise when the thin-film capacitor is mounted on a ceramic substrate. A ceramic substrate has a coefficient of linear expansion smaller than that of a resin substrate, but has a Young's modulus higher than that of the resin substrate. Therefore, it is still true that large tensile stress occurs in bumps.

Additionally, when a sapphire substrate (having a coefficient of linear expansion of about 8 ppm/° C.) or a quartz substrate (having a coefficient of linear expansion of about 0.5 ppm/° C.) is used as a substrate of the thin-film capacitor, the above-described problems arise due to the difference in coefficient of linear expansion between the substrate used and a mounting board.

When the thin-film capacitor is used as a decoupling capacitor for a microprocessing unit (MPU) of a computer or the like, it may be necessary to increase the equivalent series resistance (ESR) of the thin-film capacitor. Generally, a plurality of capacitors is used as decoupling capacitors for an MPU, and a capacitor having a capacitance greater than that of the thin-film capacitor is disposed at a position more distant from the MPU than the thin-film capacitor is. Such simultaneous use of capacitors having different capacitances and inductances is known to cause a phenomenon in which impedance increases at a specific frequency. It is also known that such phenomenon can be prevented by increasing the ESR of the thin-film capacitor. Since the thin-film capacitor has a small ESR because of its structure, a relatively thick resistive film is disposed between electrodes to increase the ESR. However, insertion of the thick resistive film causes the electrodes of the capacitor to be stressed. This is attributed to the fact that since the deposition stress of a nitride film typically used as a resistor is large and the Young's modulus of the resistor is high, a large stress is applied to the electrodes.

SUMMARY OF THE INVENTION

The present invention has been made in view of the problems described above. An object of the present invention is to provide a thin-film capacitor and a method for making the thin-film capacitor having a structure that can prevent vertical stress acting on outer connecting terminals, such as bumps, from concentrating on electrode layers, and capable of easily increase the equivalent series resistance to a desired value.

To solve the problems described above, a thin-film capacitor of the present invention includes a substrate, a capacitor unit disposed above the substrate and composed of at least one dielectric thin film and two electrode layers, a protective layer covering at least part of the capacitor unit, a lead conductor electrically connected to one of the electrode layers of the capacitor unit, and an outer connecting terminal disposed above the lead conductor. The lead conductor includes a connecting part disposed in an opening in the protective layer and electrically connected to one of the electrode layers of the capacitor unit, and a wiring part extending over the protective layer. The outer connecting terminal is disposed above the wiring part.

Since the outer connecting terminal, such as a bump, is separated from the connecting part connected to the electrode layer, stress acting on the outer connecting terminal, such as a bump, is not directly applied to the electrode layer and thus, it is possible to prevent separation of the electrode layers. Additionally, by appropriately selecting the length, thickness, and material of the wiring part, it is made possible to relatively freely adjust the resistance in the wiring part and thus to easily adjust the equivalent series resistance (ESR).

In the thin-film capacitor of the present invention, at least one sublayer of the protective layer may be an organic insulator.

When at least one sublayer of the protective layer is an organic insulator having a low Young's modulus, since stress acting on the outer connecting terminal, such as a bump, is absorbed by elastic deformation of the organic insulator, it is possible to further reduce the stress acting on the electrodes. The protective layer may have either a single layer structure composed only of the organic insulator or a multilayer structure composed of other layers as well as the organic insulator.

In the thin-film capacitor of the present invention, the wiring part may be connected to a plurality of connecting parts.

The equivalent series inductance (ESL) can be reduced by increasing the number of connecting parts connected to an electrode. However, due to circumstances relating to the mounting board, it may not be possible to increase the number of outer connecting terminals, such as bumps, in response to an increase in the number of connecting parts. In the present invention, where the wiring part is connected to a plurality of connecting parts, it is only necessary to form a single outer connecting terminal, such as a bump, with respect to a plurality of connecting parts. Therefore, even if the number of outer connecting terminals, such as bumps, is limited, the number of connecting parts can be increased, and thus, the ESL can be effectively reduced. In a typical conventional structure, such as that described in Patent Document 1, since outer connecting terminals, such as bumps, are disposed directly on the parts corresponding to the connecting parts of the present invention, it is necessary to prepare as many outer connecting terminals, such as bumps, as there are connecting parts. However, with the structure unique to the present invention where an outer connecting terminal, such as a bump, is disposed above a wiring part, a single outer connecting terminal, such as a bump, can be shared by a plurality of connecting parts.

Preferably, the wiring part has at least one bent portion. Providing at least one bent portion in the middle of the wiring part makes it possible to more effectively reduce stress acting on the outer connecting terminal, such as a bump, and reduce stress transmitted to the electrode layer.

Preferably, the wiring part includes a first conductor line and a second conductor line connected to the first conductor line via the bent portion, and the first conductor line and the second conductor line are parallel to each other.

This makes it possible to increase the length of the wiring part within a limited area and give more room for reduction of stress and adjustment of the ESR. At the same time, since the first conductor line and the second conductor line are arranged in parallel, a magnetic field generated in the first conductor line and a magnetic field generated in the second conductor line cancel each other out. Therefore, the equivalent series inductance (ESL) generated in the wiring part can be reduced.

Preferably, there is provided a first lead conductor electrically connected to a first electrode layer of the capacitor unit; and a second lead conductor electrically connected to a second electrode layer of the capacitor unit, the second electrode layer having a potential different from that of the first electrode layer. The first lead conductor includes a first connecting part electrically connected to the first electrode layer, and a first wiring part extending over the protective layer from the first connecting part in a direction away from the second lead conductor. The second lead conductor includes a second connecting part electrically connected to the second electrode layer, and a second wiring part extending over the protective layer from the second connecting part in a direction away from the first lead conductor.

In this case, it is possible to shorten a current path and reduce ESR. At the same time, in the region where the first and second electrode layers of the capacitor unit face each other, an area where the directions of currents flowing in the first and second electrode layers are opposite can be increased. Therefore, since a magnetic field generated in the region where the first and second electrode layers of the capacitor unit face each other can be reduced, the overall ESL of the thin-film capacitor can be reduced.

Preferably, a plurality of connecting parts of the lead conductor is electrically connected to one of the electrode layers of the capacitor unit.

This makes it possible to reduce ESR and ESL generated in the connecting parts of the lead conductor.

As described above, according to the present invention, since the outer connecting terminal, such as a bump, is disposed above the wiring part connected to the connecting part, stress acting on the outer connecting terminal, such as a bump, is not directly applied to the electrode layer and thus, it is possible to prevent separation of electrode layers. Additionally, by appropriately selecting the length, thickness, and material of the wiring part, it is made possible to relatively freely adjust the resistance in the wiring part and thus to easily adjust the equivalent series resistance (ESR).

Moreover, providing a bent portion in the wiring part makes it possible to more effectively absorb stress acting on the outer connecting terminal, such as a bump. Additionally, when the first conductor line and the second conductor line connected to each other via the bent portion are arranged in parallel, the equivalent series inductance (ESL) generated in the wiring part can be reduced.

BRIEF DESCRIPTION OF DRAWINGS

FIG. 5(a) and FIG. 5(b) are cross-sectional views of the thin-film capacitor according to the second embodiment of the present invention.

FIG. 13(a) and FIG. 13(b) are a plan view and a cross-sectional view, respectively, illustrating a thin-film capacitor according to a seventh embodiment of the present invention.

Figure 1:
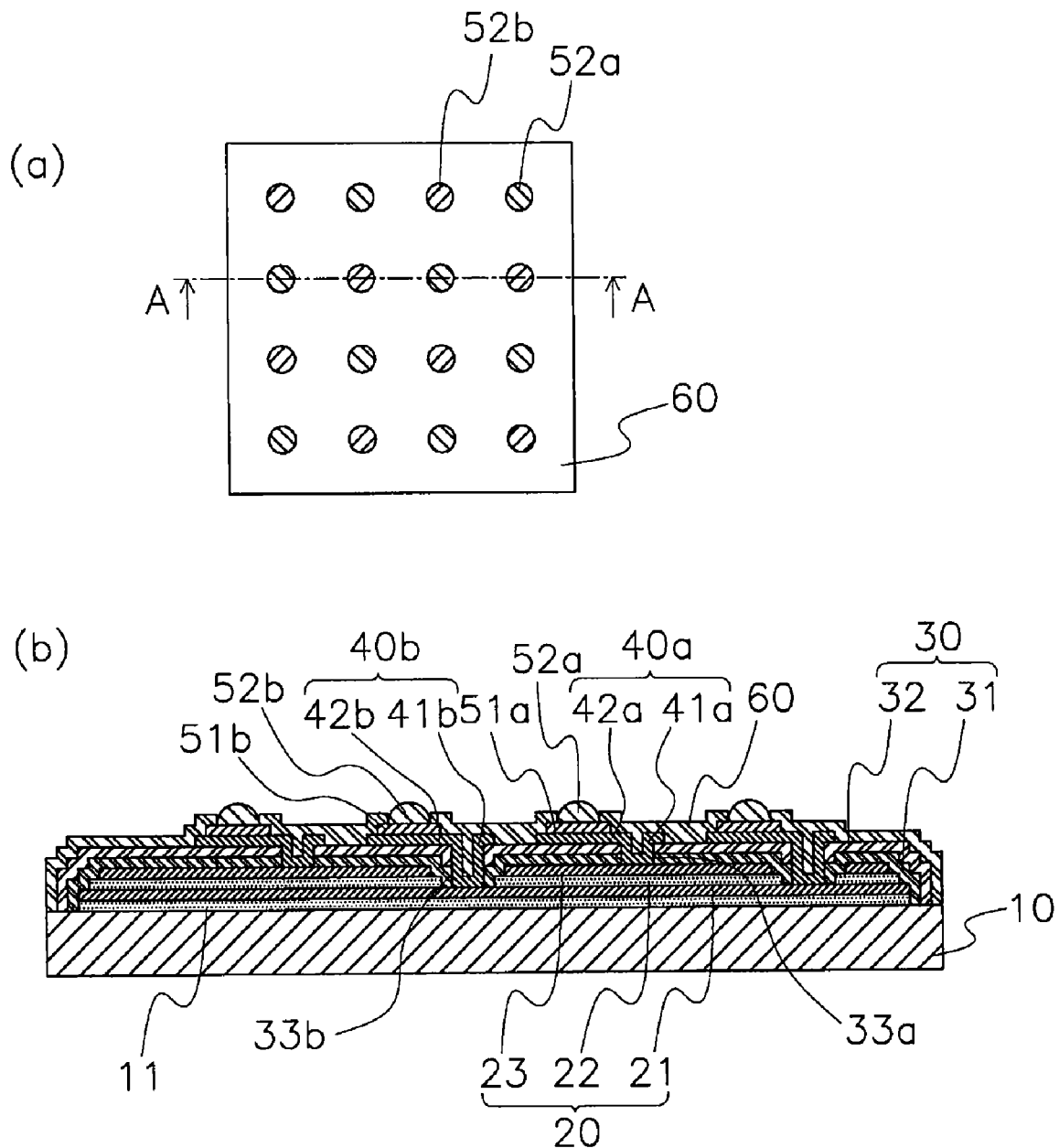
FIG. 1(a) and FIG. 1(b) are a plan view and a cross-sectional view, respectively, illustrating a thin-film capacitor according to a first embodiment of the present invention.

REFERENCE NUMERALS 10 substrate
20 capacitor unit
21 lower electrode
22 dielectric thin film
23 upper electrode
30 protective layer
31 inorganic insulating layer
32 first organic insulating layer
40a, 40b lead conductors
41a, 41b connecting parts
42a, 42b wiring parts
52a, 52b bumps (outer connecting terminals)
200 thin-film capacitor
210 substrate
216 capacitor unit
218 protective layer
220 lower electrode
222 dielectric thin film
224 upper electrode
230 inorganic insulating layer
240 organic insulating layer
252a, 252b lead conductors
254a, 254b connecting parts
256a, 256b wiring parts
260a, 260b outer electrodes (outer connecting terminals
270 outer protective layer
300 thin-film multilayer capacitor (thin-film capacitor)
310 substrate
314 capacitor unit
316 protective layer
320, 322, 324, 326 inner electrodes
330, 332, 334, 336 dielectric thin films
340 inorganic insulating layer
350 organic insulating layer
360a, 360b lead conductors
362a, 362b connecting parts
364a, 364b connecting parts
366a, 366b wiring parts
370a, 370b outer electrodes (outer connecting

DESCRIPTION OF THE INVENTION

Hereinafter, best modes for carrying out the present invention will be described with reference to the attached drawings.

First Embodiment

FIG. 1(a) is a plan view of a thin-film capacitor according to a first embodiment of the present invention. FIG. 1(b) is a cross-sectional view taken along line A-A of FIG. 1(a). A thin-film capacitor of the present invention includes a substrate 10 of Si, a contact layer 11 of barium strontium titanate (BST), and a capacitor unit 20 on the contact layer 11.

The capacitor unit 20 includes a lower electrode 21 and an upper electrode 23 both made of Pt, and a dielectric thin film 22 of BST. The thin-film capacitor further includes a protective layer 30 disposed over the capacitor unit 20. The protective layer 30 has a two-layer structure composed of an inorganic insulating layer 31 and a first organic insulating layer 32. The inorganic insulating layer 31 is made of silicon nitride and the first organic insulating layer 32 is made of polyimide.

The protective layer 30 has a first opening 33a, through which a first lead conductor 40a is connected to the upper electrode 23. More specifically, the first lead conductor 40a includes a first connecting part 41a disposed inside the first opening 33a and connected to the upper electrode 23, and a first wiring part 42a connected to the first connecting part 41a and disposed on the protective layer 30.

A first under-bump layer 51a of Ni is disposed on the first wiring part 42a. A first bump 52a of solder is disposed on the first under-bump layer 51a. The first under-bump layer 51a is provided for preventing solder leaching and may be removed depending on the material and thickness of the first wiring part 42a.

The protective layer 30 further has a second opening 33b. A second connecting part 41b of a second lead conductor 40b is disposed inside the second opening 33b and connected to the lower electrode 21. A second under-bump layer 51b and a second bump 52b are disposed on a second wiring part 42b connected to the second connecting part 41b.

A second organic insulating layer 60 of benzocyclobutene (BCB) is disposed over the lead conductors 40a and 40b and the first organic insulating layer 32.

In the above-described structure of the thin-film capacitor of the present invention, since the bumps 52a and 52b are positioned off the respective vertical axes of the connecting parts 41a and 41b, stress vertically (longitudinally in FIG. 1(b)) or horizontally (laterally in FIG. 1(b)) applied to the bumps 52a and 52b is absorbed by the protective layer 30. Therefore, large stress is not applied to either the upper electrode 23 or the lower electrode 21. Although an interlayer bonding strength between the upper electrode 23 and the dielectric thin film 22 and that between the lower electrode 21 and the contact layer 11 are not strong, it is possible to prevent separation between the upper electrode 23 and the dielectric thin film 22 and between the lower electrode 21 and the contact layer 11. It is also possible to prevent short circuits caused by damage to the dielectric thin film 22.

In the present embodiment, the protective layer 30 includes the first organic insulating layer 32, on which the lead conductors 40a and 40b are disposed. Therefore, since the stress vertically and horizontally applied to the bumps 52a and 52b can be absorbed by elastic deformation of the first organic insulating layer 32, the stress transmitted to the connecting parts 41a and 41b can be more effectively reduced.

Moreover, in the present embodiment, the under-bump layers 51a and 51b are disposed on the lead conductors. This makes the present invention more effective.

That is, for prevention of solder leaching, the under-bump layers 51a and 51b are often made of Ni exhibiting high self-stress when deposited into layers and have a thickness greater than a predetermined value. Therefore, stress generated in the under-bump layers 51a and 51b is not very small.

In the present invention, since the under-bump layers 51a and 51b are disposed on the wiring parts 42a and 42b, respectively, which are separated from the connecting parts 41a and 41b, stress generated during deposition of the under-bump layers 51a and 51b can be prevented from being transmitted through connecting layers to the upper electrode 23 and the lower electrode 21. Even if the stress reaches the wiring parts 42a and 42b, since the stress is absorbed by the protective layer 30 under the wiring parts 42a and 42b, it is possible to prevent large stress to occur in the upper electrode 23 and the lower electrode 21.

For reasons relating to the design of equipment on which the thin-film capacitor is mounted, the ESR of the thin-film capacitor may need to be greater than a predetermined value. Even in such a case, since the present invention makes it possible to easily increase resistance in the wiring parts 42a and 42b by extending the wiring of the wiring parts 42a and 42b, it is easy to increase the ESR of the thin-film capacitor. On the other hand, a smaller ESR is achieved when the wiring parts 42a and 42b are made of highly conductive material, reduced in length, and increased in width or thickness.

Figure 2:
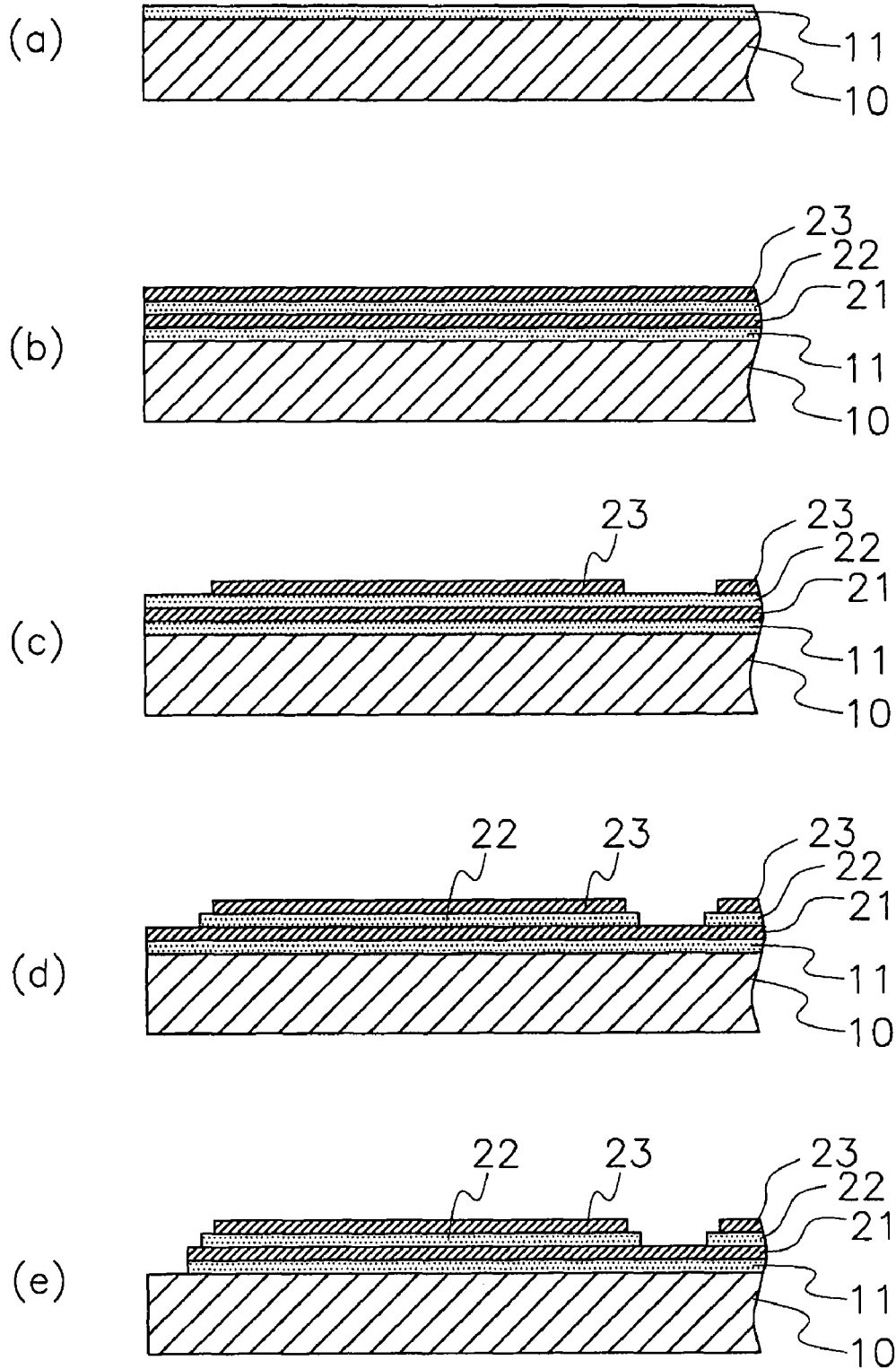
FIG. 2(a) to FIG. 2(e) are cross-sectional views illustrating a process of making the thin-film capacitor according to the first embodiment of the present invention.
Figure 3:
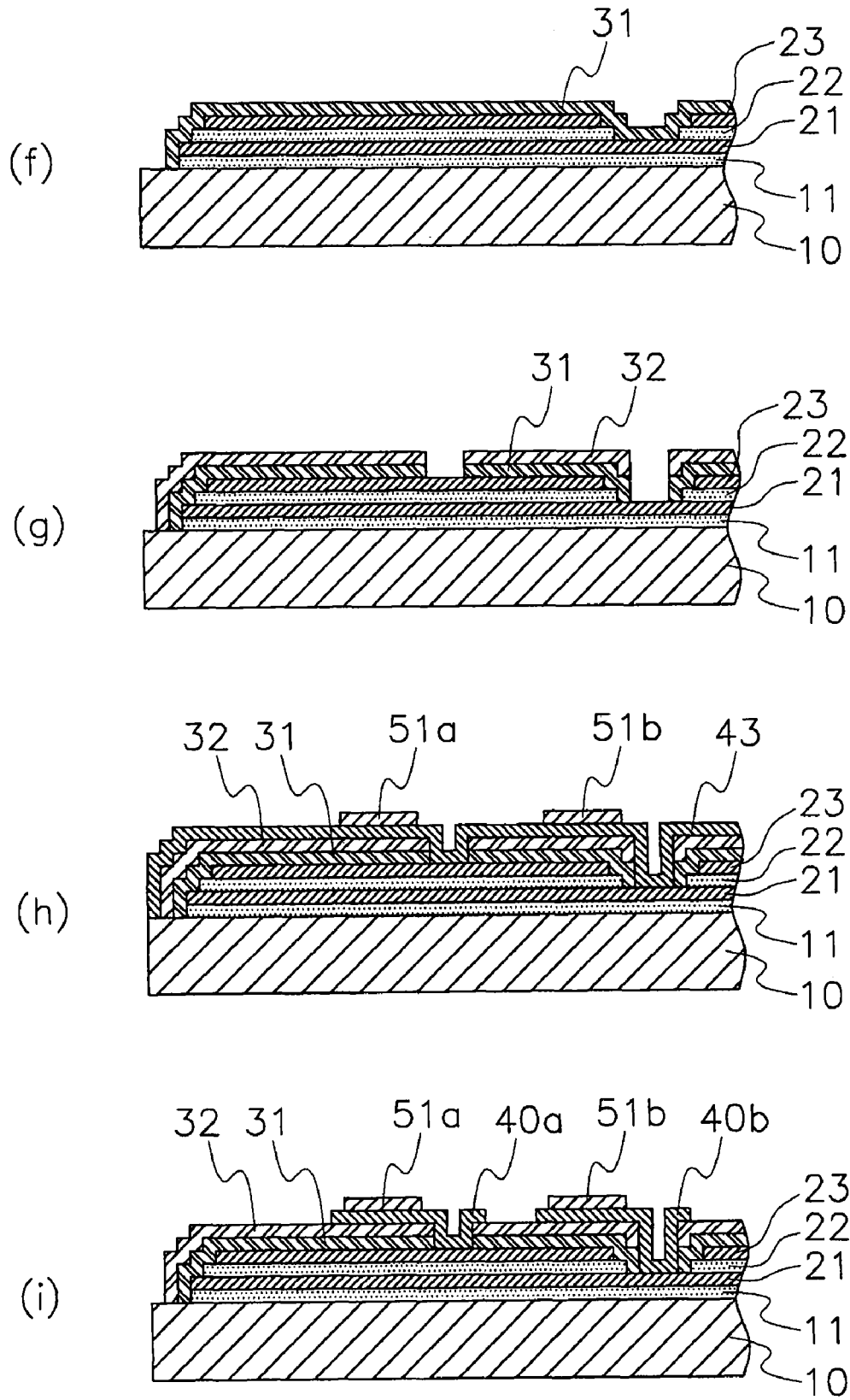
FIG. 3(f) to FIG. 3(i) are cross-sectional views illustrating the process of making the thin-film capacitor according to the first embodiment of the present invention.

Next, a method for making the thin-film capacitor of the present embodiment will be described with reference to FIG. 1 to FIG. 3. FIG. 2 and FIG. 3 are cross-sectional views illustrating a process for making the thin-film capacitor.

First, as illustrated in FIG. 2(a), the substrate 10 made of Si and provided with a thermally-oxidized film (not shown) is prepared. The substrate 10 is spin-coated with MOD raw material solution made of BST containing an organic compound of Ba, Sr, and Ti. Then, the substrate 10 is subjected to heat treatment for 30 minutes at a temperature of 625° C. in an oxygen atmosphere. Thus, the contact layer 11 made of BST and having a thickness of 50 nm is formed.

Next, the lower electrode 21 made of Pt and having a thickness of 200 nm is formed by sputtering. Then, the lower electrode 21 is coated with the MOD raw material solution of BST and subjected to heat treatment under the same conditions as those described above. Thus, the dielectric thin film 22 of 100 nm thick is formed on the lower electrode 21. Additionally, the upper electrode 23 made of Pt and having a thickness of 200 nm is formed on the dielectric thin film 22 by sputtering (see FIG. 2(b)).

Next, the upper electrode 23 is coated with a resist, exposed to light and developed for patterning of the resist, and subjected to dry etching. Thus, the upper electrode 23 is patterned as illustrated in FIG. 2(c).

Next, by performing heat treatment for 30 minutes at a temperature of 850° C. in an oxygen atmosphere, the crystallinity of the dielectric thin film 22 is increased. Then, the dielectric thin film 22 is coated with a resist, exposed to light, developed, and subjected to wet etching. Thus, the dielectric thin film 22 is patterned as illustrated in FIG. 2(d).

Then, through the process of resist coating, light exposure, development, and dry etching, the lower electrode 21 and the contact layer 11 are partially removed at the device periphery (see FIG. 2(e)).

Next, as illustrated in FIG. 3(f), the inorganic insulating layer 31 made of silicon nitride and having a thickness of 1 μm is formed by sputtering. Then, the inorganic insulating layer 31 is coated with photosensitive polyimide, exposed to light, developed, and cured. Thus, the first organic insulating layer 32 of 3 μm thick is formed. The inorganic insulating layer 31 is patterned by dry etching, with the first organic insulating layer 32 serving as a mask (see FIG. 3(g)).

Next, a 100-nm-thick Ti layer and a 500-nm-thick Cu layer are deposited in this order by sputtering to form a metal layer 43. That is, the metal layer 43, which is illustrated as a single layer in the drawing, actually has a two-layer structure composed of the Ti and Cu layers. The metal layer 43 is coated with a film resist, exposed to light, and developed. Then, electrolytic plating is performed, with the metal layer 43 serving as a power feeding layer. Thus, the under-bump layers 51a and 51b made of Ni and having a thickness of 2 μm are formed (see FIG. 3(h)).

Then, after the process of resist coating, light exposure, and development, the Cu layer is partially removed by wet etching and the Ti layer is partially removed by dry etching. Thus, the metal layer 43 is patterned to form the lead conductors 40a and 40b (see FIG. 3(i)).

Then, the second organic insulating layer 60 is formed by the process of application of photosensitive benzocyclobutene (BCB), light exposure, development, and curing. Next, by electrolytic plating, a 500-nm-thick Ni layer and a 500-nm-thick Au layer (not shown) are deposited in this order on exposed parts of the under-bump layers 51a and 51b. Then, the bumps 52a and 52b of Sn—Ag—Cu lead-free solder are formed to complete the process of making the thin-film capacitor illustrated in FIG. 1.

Second Embodiment

Figure 4:
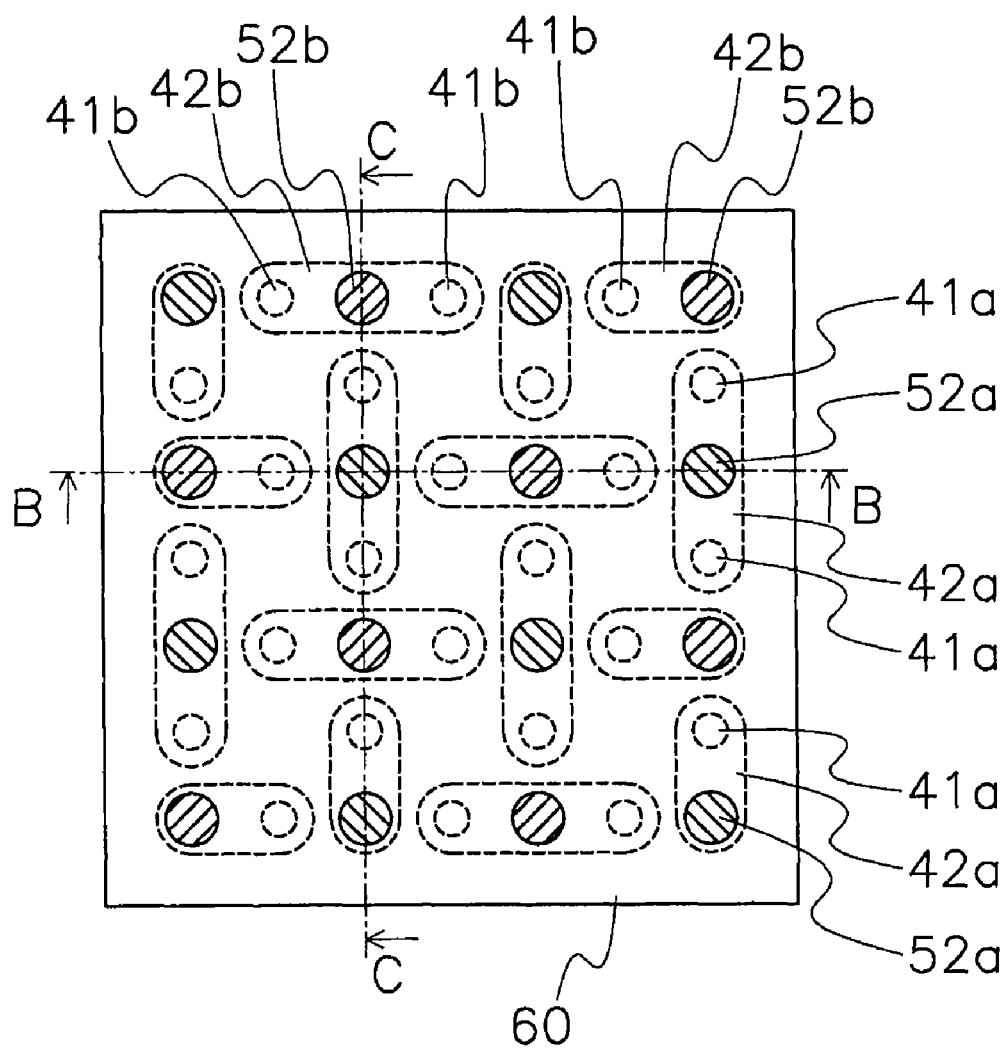
FIG. 4 is a plan view of a thin-film capacitor according to a second embodiment of the present invention.

A thin-film capacitor according to a second embodiment of the present invention will now be described. FIG. 4 is a plan view illustrating the thin-film capacitor of the present embodiment. FIG. 5(a) is a cross-sectional view taken along line B-B of FIG. 4. FIG. 5(b) is a cross-sectional view taken along line C-C of FIG. 4. In FIG. 4 and FIG. 5, components common or corresponding to those in FIG. 1 to FIG. 3 are given the same reference numerals, and the description thereof will be omitted.

The thin-film capacitor of the present embodiment is characterized in that some first wiring parts 42a each are connected to two first connecting parts 41a, and some second wiring parts 42b each are connected to two second connecting parts 41b. Therefore, two connecting parts 41a can be provided for one bump 52a and two connecting parts 41b can be provided for one bump 52b.

Generally, as the number of connecting parts 41a and 41b increases, the ESL of the thin-film capacitor decreases. As described in the first embodiment, since patterning of the thin-film capacitor is done by photolithography which enables highly accurate processing, the distance between adjacent connecting parts can be reduced to as small as about 100 μm. On the other hand, in a ceramic multilayer substrate or a resin substrate on which the thin-film capacitor is mounted, since it is difficult to form conductive patterns with high accuracy, it is difficult to reduce the distance between adjacent lands to which bumps are connected to as small as about 100 μm.

In a conventional thin-film capacitor, such as that described in Patent Document 1, since connecting parts are disposed directly below bumps, the distance between adjacent connecting parts is limited by the distance between adjacent lands of a mounting board to which the bumps are connected. On the other hand, in the thin-film capacitor of the present embodiment, the bumps and the connecting parts differ in position, and at the same time, a greater number of connecting parts than the number of bumps can be formed. Therefore, since the distance between adjacent connecting parts is not limited by the distance between adjacent lands, it is possible to reduce the distance between adjacent connecting parts, and thus to reduce the ESL.

The thin-film capacitor of the present embodiment can be made with a method similar to that for the thin-film capacitor of the first embodiment.

Comparative Embodiment

Figure 6:
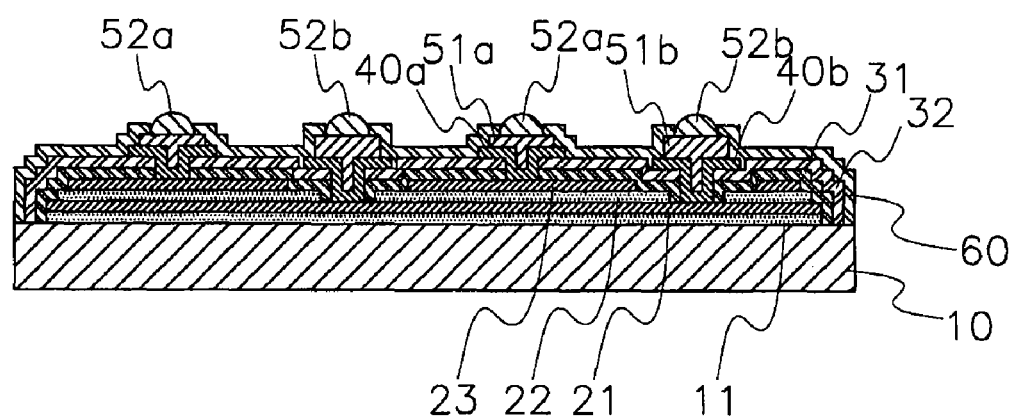
FIG. 6 is a cross-sectional view of a thin-film capacitor according to a comparative embodiment.

As a comparative embodiment, a thin-film capacitor illustrated in FIG. 6 is made with a method similar to that described in the first embodiment. As in the case of the conventional thin-film capacitor described above, the lead conductors 40a and 40b of the thin-film capacitor of FIG. 6 are composed only of parts equivalent to the connecting parts of the present invention, and the bumps 52a and 52b are disposed directly above the corresponding lead conductors 40a and 40b.

Figure 7:
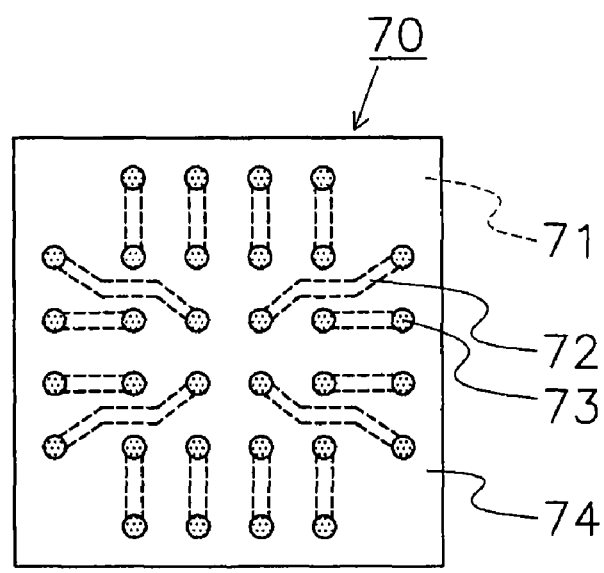
FIG. 7 is a plan view of a mounting board used in an experiment.

The following experiment was performed to confirm the effect of the present invention. First, as illustrated in FIG. 7, there was prepared a mounting board 70 including a 1.27-mm-thick glass-epoxy substrate 71 (having a coefficient of linear expansion of about 40 ppm/° C.) and a 35-μm-thick Cu circuit 72 on the mounting board 70. The mounting board 70 was made by forming a solder resist layer 74 while leaving pads 73 as they were. Ten thin-film capacitors according to the first, second, and comparative embodiments each were prepared as samples and mounted on each mounting board 70. Immediately after the mounting, every sample was checked for breaks and short circuits inside the thin-film capacitor.

Next, the mounted samples were subjected to a thermal cycle test 1000 times at temperatures ranging from −55° C. to +125° C. and checked for short circuits between the upper and lower electrodes. Although no short circuit occurred in any thin-film capacitors of the first and second embodiments, short circuits occurred in 2 out of 10 thin-film capacitors of the comparative embodiment.

Third Embodiment

Figure 8:
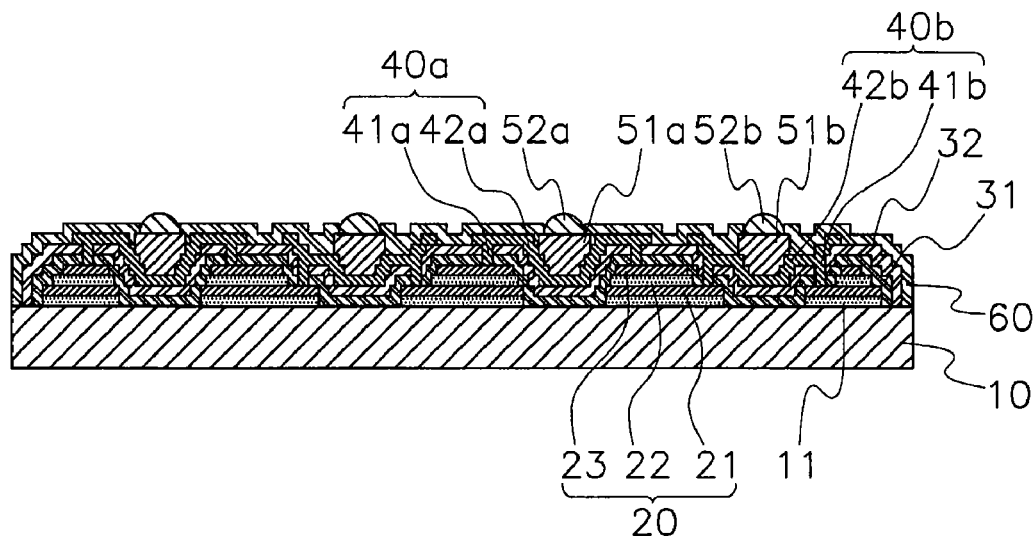
FIG. 8 is a cross-sectional view of a thin-film capacitor according to a third embodiment of the present invention.

FIG. 8 illustrates a thin-film capacitor according to a third embodiment of the present invention. The thin-film capacitor illustrated in FIG. 8 is a modification of that of the first embodiment. The planar arrangement of the bumps 52a and 52b is identical to that illustrated in FIG. 1 and thus is not illustrated here.

The thin-film capacitor of the third embodiment is characterized in that the upper electrode 23, the dielectric thin film 22, and the lower electrode 21 are partially removed at their portions directly below the bumps 52a and 52b. Therefore, no capacitor units are present directly below the bumps 52a and 52b. Even when the bumps 52a and 52b are stressed in the vertical or horizontal direction, it is possible to prevent damage to capacitor units directly below the bumps 52a and 52b.

The thin-film capacitor of the present embodiment can be made by a process similar to that for the first embodiment. However, before the step of depositing the inorganic insulating layer 31, an additional step needs to be performed to partially remove the upper electrode 23, the dielectric thin film 22, the lower electrode 21, and the contact layer 11 by dry etching or wet etching.

Fourth Embodiment

Figure 9:
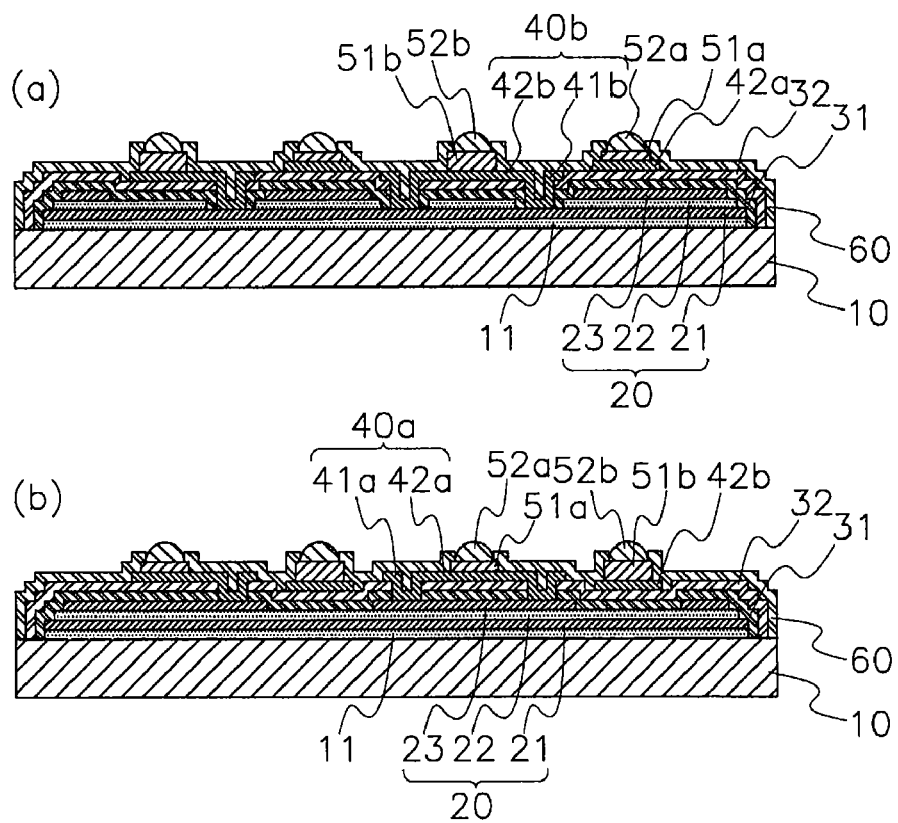
FIG. 9(a) and FIG. 9(b) are cross-sectional views of a thin-film capacitor according to a fourth embodiment of the present invention.
Figure 10:
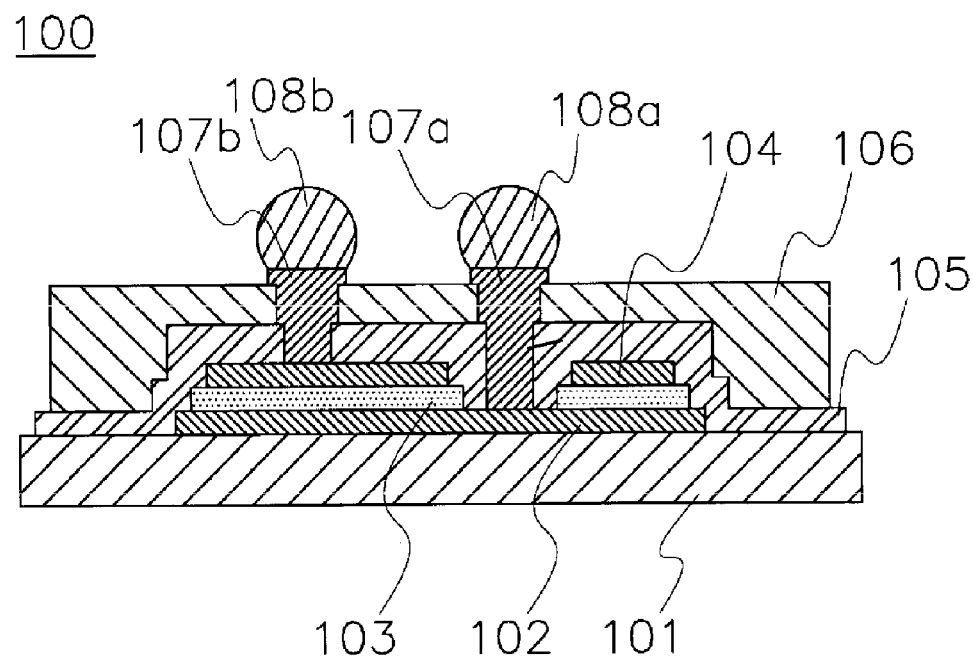
FIG. 10 is a cross-sectional view of a conventional thin-film capacitor.

FIG. 9 illustrates a thin-film capacitor according to a fourth embodiment of the present invention. The thin-film capacitor illustrated in FIG. 9 is a modification of that of the second embodiment. The planar arrangement of bumps is identical to that illustrated in FIG. 4. FIG. 9(a) is a cross-sectional view taken along line B-B of FIG. 4. FIG. 9(b) is a cross-sectional view taken along line C-C of FIG. 4.

The thin-film capacitor of the fourth embodiment is characterized in that the upper electrode 23 is partially removed at its portion directly below the bump 52b. This prevents a capacitor to be created between the lead conductor 40b and the upper electrode 23. Since this prevents application of an electric field to the protective layer 30 (composed of the inorganic insulating layer 31 and the first organic insulating layer 32), it is possible to prevent short circuits and leakage in the protective layer 30 and improve reliability of the capacitor.

The thin-film capacitor of the present embodiment can be made by a process similar to that for the second embodiment. However, before the step of depositing the inorganic insulating layer 31, an additional step needs to be performed to partially remove the upper electrode 23 at a position directly below the bump 52b by dry etching or wet etching.

As described above, in the present invention, there are provided lead conductors each including a connecting part and a wiring part, and a bump is disposed above the wiring part. Since this prevents stress on the bump from directly applied to electrode layers, problems such as separation and short circuits can be prevented. At the same time, with an appropriate length, width, length, or material of the wiring part, the equivalent series resistance can be set to a desired value.

Fifth Embodiment

Figure 11:
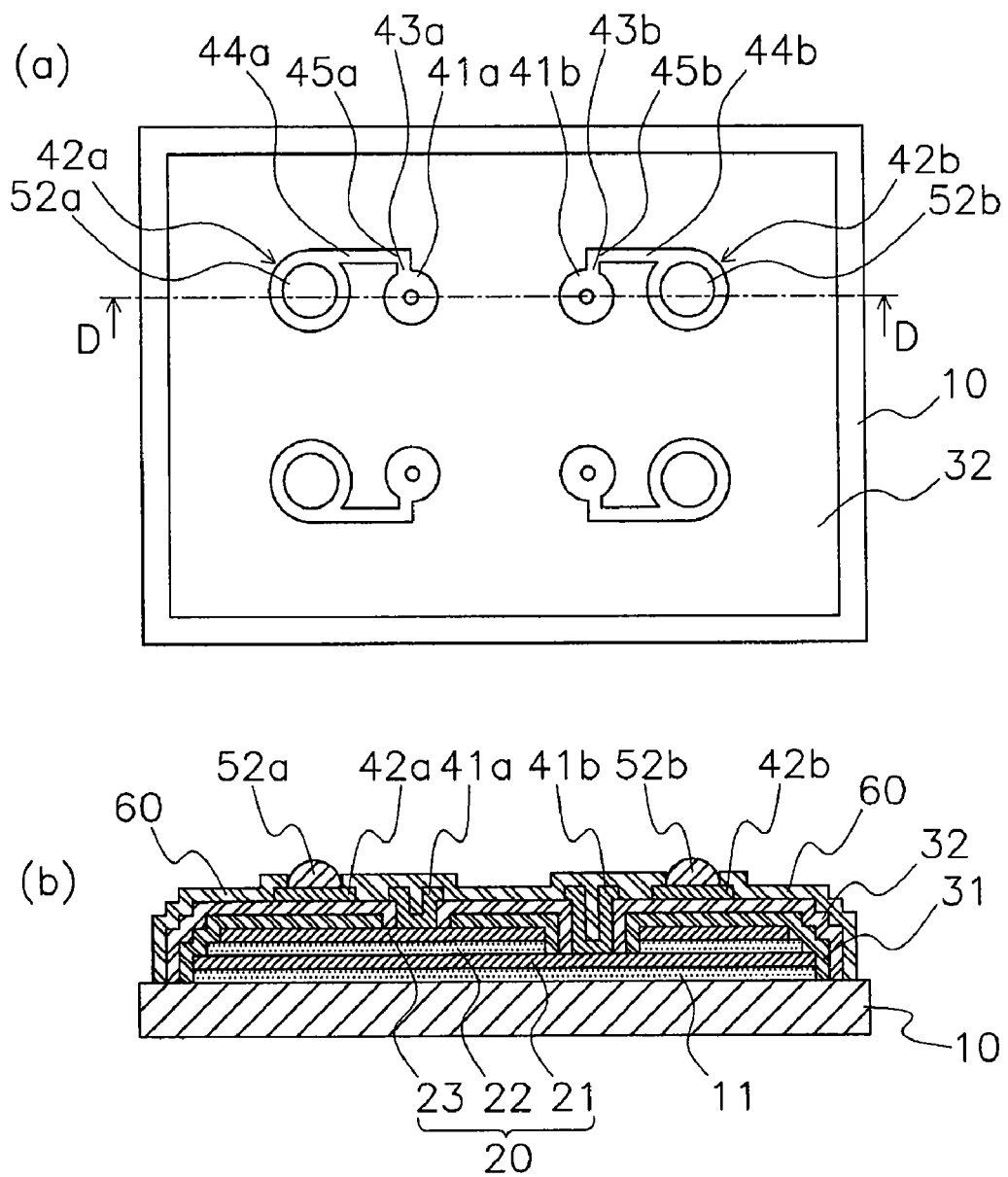
FIG. 11(a) and FIG. 11(b) are a plan view and a cross-sectional view, respectively, illustrating a thin-film capacitor according to a fifth embodiment of the present invention.

FIG. 11(a) is a plan view of a thin-film capacitor according to a fifth embodiment of the present invention. FIG. 11(b) is a cross-sectional view taken along line D-D of FIG. 11(a). For convenience of reference, FIG. 11(a) illustrates the thin-film capacitor as viewed through the organic insulating layer.

In the thin-film capacitor of the present embodiment, the wiring part 42a includes a first conductor line 43a, a second conductor line 44a, and a bent portion 45a between the first and second conductor lines; and the second wiring part 42b includes a first conductor line 43b, a second conductor line 44b, and a bent portion 45b between the first and second conductor lines. The first conductor line 43a is connected to the connecting part 41a connected to the upper electrode 23, and the bump 52a is disposed at an end of the second conductor line 44a. Similarly, the first conductor line 43b is connected to the connecting part 41b connected to the lower electrode 21, and the bump 52b is disposed at an end of the second conductor line 44b.

In the present embodiment, the bent portions 45a and 45b are formed in the middle of the wiring parts 42a and 42b by bending the conductor lines at right angles. Therefore, it is possible to more effectively reduce stress acting on the bumps 52a and 52b and reduce stress transmitted to the upper electrode 23 and the lower electrode 21.

Sixth Embodiment

Figure 12:
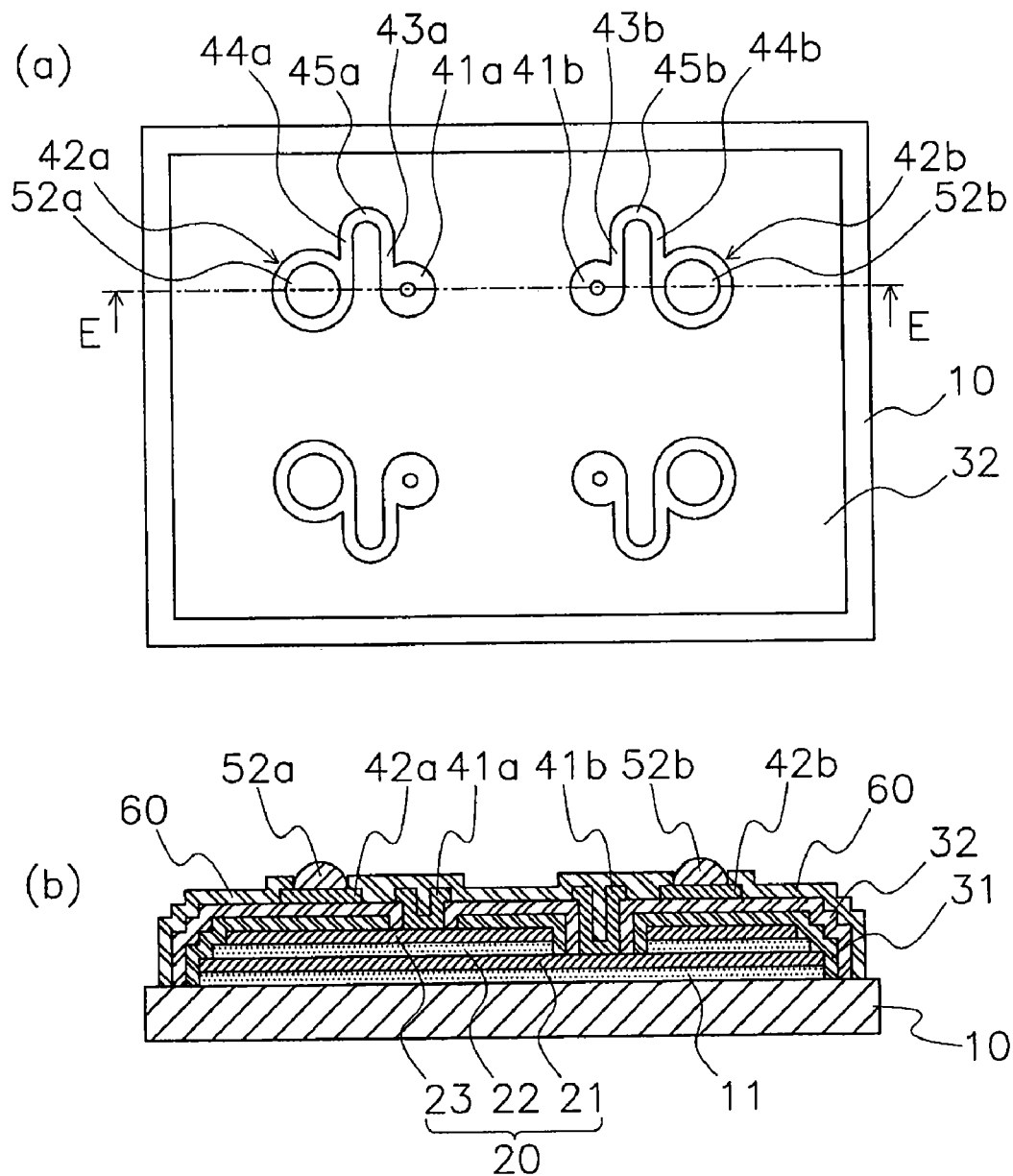
FIG. 12(a) and FIG. 12(b) are a plan view and a cross-sectional view, respectively, illustrating a thin-film capacitor according to a sixth embodiment of the present invention.

FIG. 12(a) is a plan view of a thin-film capacitor according to a sixth embodiment of the present invention. FIG. 12(b) is a cross-sectional view taken along line E-E of FIG. 12(a). For convenience of reference, FIG. 12(a) illustrates the thin-film capacitor as viewed through the organic insulating layer 60.

The thin-film capacitor of the present embodiment is a modification of that of the fifth embodiment, and is characterized in that the conductor lines are bent 180 degrees at the bent portions 45a and 45b, the first conductor lines 43a and 43b and the second conductor lines 44a and 44b are parallel to each other, and the direction of current flowing through the first conductor lines 43a and 43b is opposite that flowing through the second conductor lines 44a and 44b.

This makes it possible to increase the length of the wiring parts 42a and 42b within a limited area and give more room for reduction of stress and adjustment of the ESR. At the same time, since the first conductor lines 43a and 43b and the second conductor lines 44a and 44b are arranged in parallel, a magnetic field generated in the first conductor lines 43a and 43b and a magnetic field generated in the second conductor lines 44a and 44b cancel each other out. Therefore, the equivalent series inductance (ESL) generated in the wiring parts 42a and 42b can be reduced.

Seventh Embodiment

A thin-film capacitor 200 according to a seventh embodiment of the present invention will now be described with reference to FIG. 13 to FIG. 16.

FIG. 13(a) is a perspective plan view of the thin-film capacitor 200. FIG. 13(b) is a cross-sectional view taken along line A-A of FIG. 13(a). For easier understanding, the illustration of an outer protective layer 270 is omitted in FIG. 13(a). Since FIG. 13(b) illustrates step portions of each layer in an enlarged and exaggerated manner, dimensions in FIG. 13(b) do not match those in FIG. 13(a).

As illustrated in FIG. 13, the thin-film capacitor 200 is a two-terminal thin-film capacitor in which a pair of outer electrodes 260a and 260b serving as outer connecting terminals is exposed from the outer protective layer 270.

The thin-film capacitor 200 is made by forming, on a thermally-oxidized film 212 of a Si substrate 210, a contact layer 214 of BST, a capacitor unit 216, a protective layer 218, lead conductors 252a and 252b, outer electrodes 260a and 260b, and the outer protective layer 270, in this order.

The capacitor unit 216 includes an upper electrode 224 and a lower electrode 220 that are made of Pt and a dielectric thin film 222 of BST interposed between the upper electrode 224 and the lower electrode 220. The capacitor unit 216 is covered with the protective layer 218 having a two-layer structure composed of an inorganic insulating layer 230 and an organic insulating layer 240. The inorganic insulating layer 230 is made of silicon nitride and the organic insulating layer 240 is made of polyimide.

The lead conductors 252a and 252b are disposed on the protective layer 218. The lead conductor 252a includes connecting parts 254a connected to the electrode 220 through openings of the protective layer 218 and wiring parts 256a extending from the connecting parts 254a. Similarly, the lead conductor 252b includes connecting parts 254b connected to the electrode 224 through openings of the protective layer 218 and wiring parts 256b extending from the connecting parts 254b.

The outer electrodes 260a and 260b are disposed on the wiring parts 256a and 256b, respectively, of the lead conductors 252a and 252b.

The primary side of the Si substrate 210 is entirely covered with the outer protective layer 270, except for the respective center portions of the outer electrodes 260a and 260b.

As illustrated in FIG. 13(a), since the outer electrodes 260a and 260b are positioned off the respective vertical axes of the connecting parts 254a and 254b of the lead conductors 252a and 252b, stress vertically (longitudinally in FIG. 13(b)) or horizontally (laterally in FIG. 13(b)) applied to the outer electrodes 260a and 260b is absorbed by the protective layer 218. Therefore, large stress is not applied to the inner electrodes 220 and 224. Although an interlayer bonding strength between the upper electrode 224 and the dielectric thin film 222 and that between the lower electrode 220 and the contact layer 214 are not strong, it is possible to prevent separation between the upper electrode 224 and the dielectric thin film 222 and between the lower electrode 220 and the contact layer 214. It is also possible to prevent short circuits caused by damage to the dielectric thin film 222.

The protective layer 218 includes the organic insulating layer 240, on which the lead conductors 252a and 252b are disposed. Therefore, since the stress vertically and horizontally applied to the outer electrodes 260a and 260b can be absorbed by elastic deformation of the organic insulating layer 240, the stress transmitted to the connecting parts 254a and 254b can be more effectively reduced.

The connecting parts 254a of the lead conductor 252a are positioned on a side adjacent to the other lead conductor 252b, and the connecting parts 254b of the lead conductor 252b are positioned on a side adjacent to the other lead conductor 252a. At the same time, the wiring parts 256a of the lead conductor 252a extend away from the other lead conductor 252b, and the wiring parts 256b of the lead conductor 252b extend away from the other lead conductor 252a. For reasons relating to the design of equipment on which the thin-film capacitor is mounted, the ESR of the thin-film capacitor may need to be greater than a predetermined value. Even in such a case, since resistance in the wiring parts 256a and 256b can be easily increased by extending the wiring of the wiring parts 256a and 256b, it is easy to increase the ESR of the thin-film capacitor. Conversely, a smaller ESR is achieved when the wiring parts 256a and 256b are made of highly conductive material, reduced in length, and increased in width or thickness.

Figure 16:
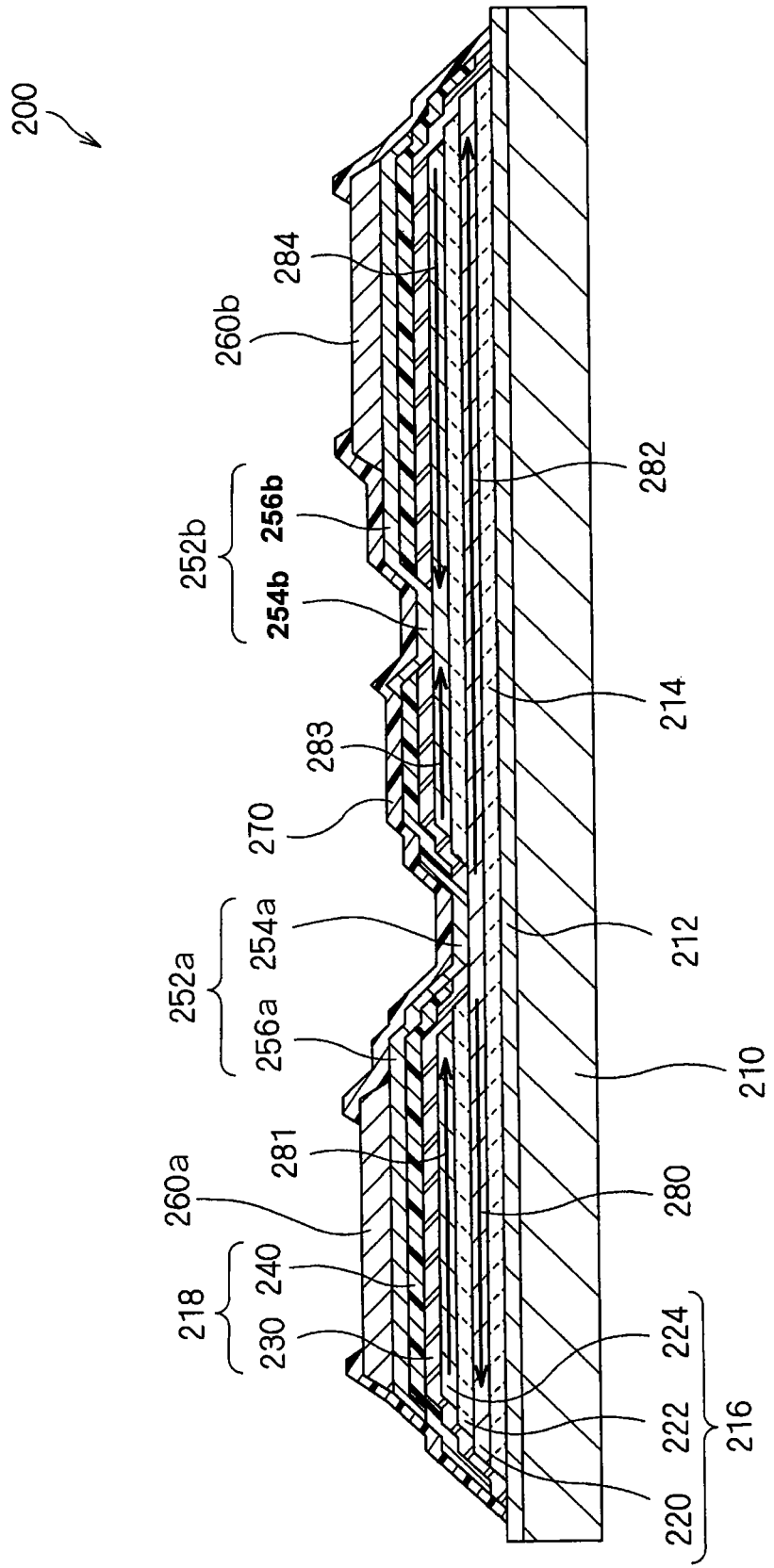
FIG. 16 is an enlarged cross-sectional view of the thin-film capacitor according to the seventh embodiment of the present invention.

FIG. 16 is an enlarged cross-sectional view of the thin-film capacitor 200. As indicated by arrows 280 to 284, in facing parts of the inner electrodes 220 and 224, there is a large area where currents flow in opposite directions. Therefore, since magnetic fields generated in the facing parts cancel each other out and are reduced, the overall ESL of the thin-film capacitor 200 can be reduced.

Moreover, the ESR can be reduced when two or more connecting parts 254a are connected to the inner electrode 220 and two or more connecting parts 254b are connected to the inner electrode 224. At the same time, since the area of the facing parts of the inner electrodes 220 and 224 can be increased, the overall ESL of the thin-film capacitor 200 can be reduced.

Figure 14:
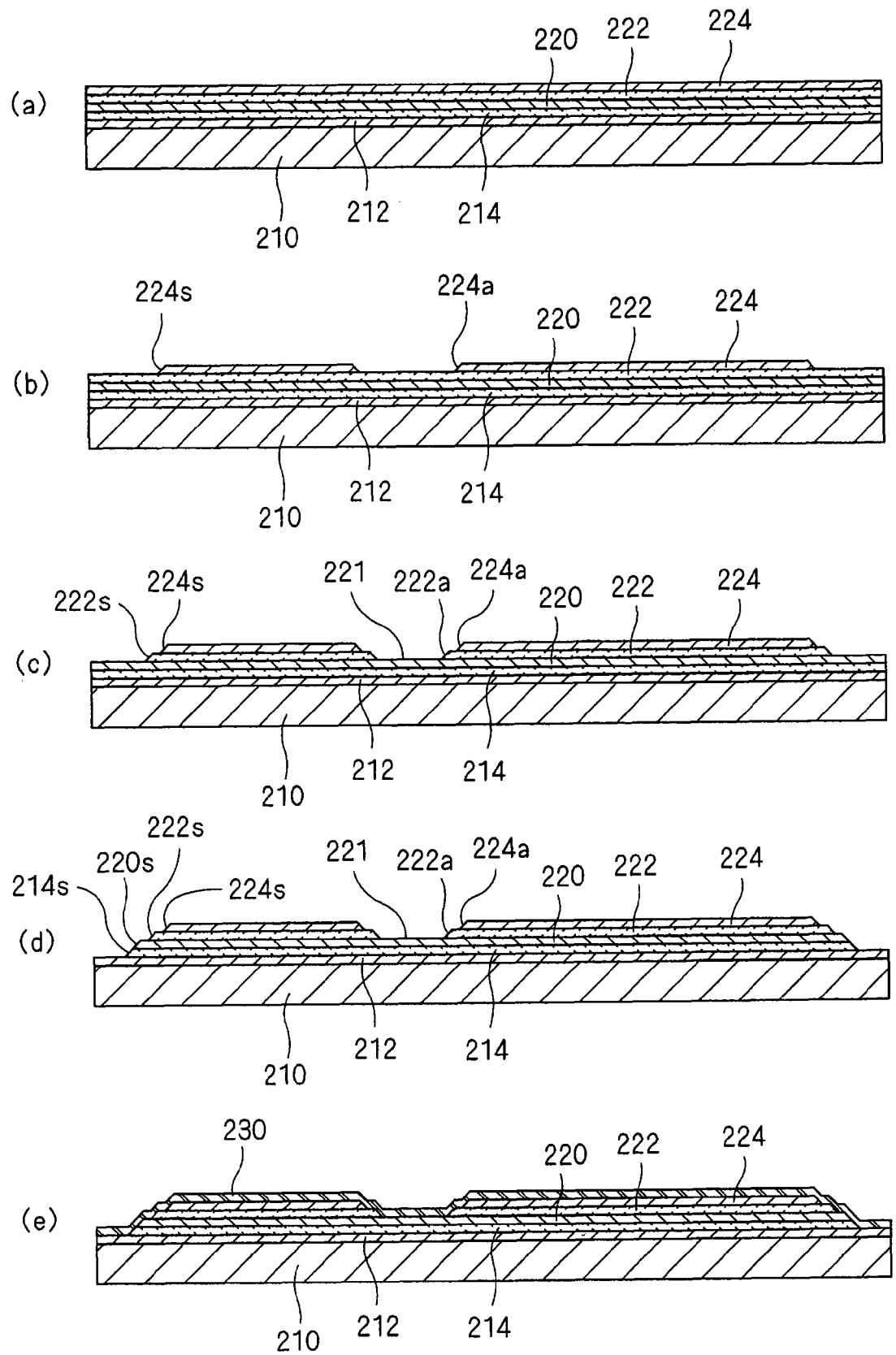
FIG. 14(a) to FIG. 14(e) are cross-sectional views illustrating a process of making the thin-film capacitor according to the seventh embodiment of the present invention.
Figure 15:
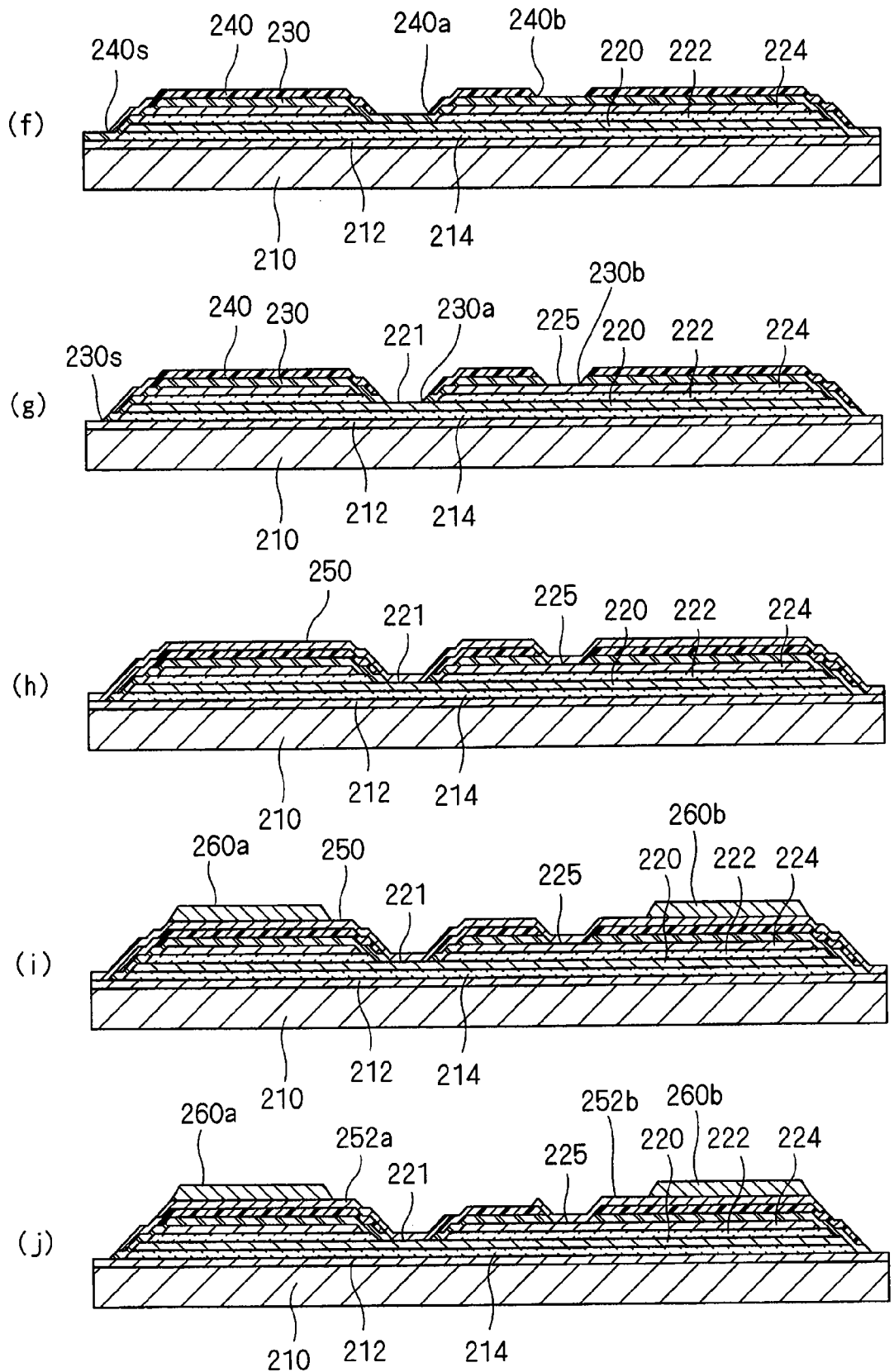
FIG. 15(f) to FIG. 15(j) are cross-sectional views illustrating the process of making the thin-film capacitor according to the seventh embodiment of the present invention.

Next, a method for making the thin-film capacitor 200 of the present embodiment will be described with reference to FIG. 14 and FIG. 15. FIG. 14 and FIG. 15 are cross-sectional views illustrating a process for making the thin-film capacitor 200.

First, as illustrated in FIG. 14(a), the Si substrate 210 provided with the thermally-oxidized film 212 and having a thickness of 525 μm is prepared. The Si substrate 210 is spin-coated with MOD raw material solution made of BST containing an organic compound composed of Ba, Sr, and Ti at a molar ratio of 7:3:10. Then, the Si substrate 210 is dried and subjected to rapid thermal annealing (RTA) for 30 minutes at a temperature of 650° C. in an oxygen atmosphere. Thus, the contact layer 214 made of BST and having a thickness of 100 nm is formed. Next, the lower electrode 220 made of Pt and having a thickness of 200 nm is formed by sputtering. The lower electrode 220 is coated with the MOD raw material solution of BST having the same molar ratio as that described above, and subjected to heat treatment under the same conditions as those described above. Thus, the dielectric thin film 222 of 100 nm thick is formed on the lower electrode 220. Additionally, the upper electrode 224 made of Pt and having a thickness of 200 nm is formed on the dielectric thin film 222 by sputtering.

Next, the upper electrode 224 is coated with a photosensitive resist, baked, exposed to light, developed, and heated to a predetermined temperature to form a resist pattern. As illustrated in FIG. 14(b), with the resulting resist pattern serving as a mask, the upper electrode 224 is processed by ion milling to form an opening 224a and an outer edge 224s. Then, the remaining resist is removed by $O_2$ plasma ashing.

Next, a resist pattern is formed in a manner similar to that described above. As illustrated in FIG. 14(c), an opening 222a and an outer edge 222s are created in the dielectric thin film 222. Thus, a portion 221 of the lower electrode 220 is exposed to form a lower electrode lead portion.

Next, as illustrated in FIG. 14(d), with a method similar to that described above, the lower electrode 220 and the contact layer 214 are processed at the device periphery to form outer edges 220s and 214s.

Next, to increase the dielectric constant of the dielectric thin film 222, the crystallinity of the dielectric thin film 222 is increased by performing heat treatment for 30 minutes at a temperature of 850° C. in an oxygen atmosphere. Then, as illustrated in FIG. 14(e), the inorganic insulating layer 230 made of silicon nitride and having a thickness of 500 nm is formed by sputtering.

Next, the inorganic insulating layer 230 is coated with photosensitive polyimide, exposed to light, developed, and cured. Thus, as illustrated in FIG. 15(f), the organic insulating layer 240 having openings 240a and 240b and an outer edge 240s and having a thickness of 3 μm is formed on the inorganic insulating layer 230.

Next, with the organic insulating layer 240 serving as a mask, the inorganic insulating layer 230 is processed by reactive ion etching (REI). Thus, as illustrated in FIG. 15(g), there are formed an outer edge 230s and openings 230a and 230b through which the respective portions 221 and 225 of the electrodes 220 and 224 are exposed.

Next, a 50-nm-thick Ti layer and a 2000-nm-thick Cu layer are deposited by sputtering to form a metal layer 250 illustrated in FIG. 15(h).

The metal layer 250 is coated with a photosensitive resist, baked, exposed to light, developed, and heated to a predetermined temperature to form a resist pattern. Then, with the resulting resist pattern serving as a mask, electrolytic plating is performed with the metal layer 250 serving as a power feeding layer, a 3000-nm-thick Cu layer is deposited in resist openings, and thus, the outer electrodes 260a and 260b are formed as illustrated in FIG. 15(i).

The outer electrodes 260a and 260b may have either a single layer structure or a multilayer structure. The type of metal of which the outer electrodes 260a and 260b is made can be changed depending on the mounting method. For example, a Cu layer may be formed as an underlying layer of an Au layer, a Ni layer may be formed as an underlying layer of an Au layer, or a Cu layer may be formed as an underlying layer of a Sn layer.

Next, the outer electrodes 260a and 260b are coated with a photosensitive resist, baked, exposed to light, developed, and heated to a predetermined temperature to form a resist pattern. Then, the metal layer 250 is partially removed by wet etching to form the lead conductors 252a and 252b illustrated in FIG. 15(j).

Next, the lead conductors 252a and 252b are coated with photosensitive polyimide, exposed to light, developed, and cured to form the outer protective layer 270 (see FIG. 13(b) and FIG. 16).

The outer protective layer 270 formed as the uppermost layer may be removed depending on the mounting method. In this case, the shape of the thin-film capacitor illustrated in FIG. 15(j) and FIG. 13(a) is the final shape.

Next, to form a predetermined shape (1.0 mm by 0.5 mm), a groove having a bottom at a depth of 40 μm from the level of the outer electrodes 260a and 260b is formed with a dicing saw, thereby half-cutting the Si substrate 210. As illustrated in FIG. 15(j), each layer is patterned such that the Si thermally-oxidized film 212 is exposed near cutting lines at the device ends.

Next, the backside of the Si substrate 210 is grinded and polished until the device thickness becomes 30 μm. For the grinding and polishing, the outer electrode side of the device is bonded to a polishing board with an adhesive. After the grinding and polishing, the device is separated by washing the adhesive away.

Alternatively, without performing the half-cutting described above, the device separation may be done by performing full-cutting after the grinding and polishing.

As described above, since the outer electrodes 260a and 260b are formed above the organic insulating layer 240, stress generated during mounting can be absorbed by the organic insulating layer 240. Moreover, since the outer electrode 260a is separated from the connecting part 254a for connection between the lead conductor 252a and the inner electrode 220, and the outer electrode 260b is separated from the connecting part 254b for connection between the lead conductor 252b and the inner electrode 224, it is possible to prevent separation of the inner electrodes 220 and 224.

In the thin-film capacitor 200, as illustrated in FIG. 16, current paths in the inner electrodes 220 and 224 are shorter than those in a conventional structure. At the same time, the directions of currents flowing in the adjacent inner electrodes 220 and 224 are substantially opposite in most areas. Therefore, since the resulting magnetic fields cancel each other out, the ESR and ESL of the thin-film capacitor 200 can be reduced.

Additionally, if the substrate 210 of Si having high fracture toughness is used, the substrate 210 can be grinded and polished to a thickness of several tens of μm.

Eighth Embodiment

Figure 17:
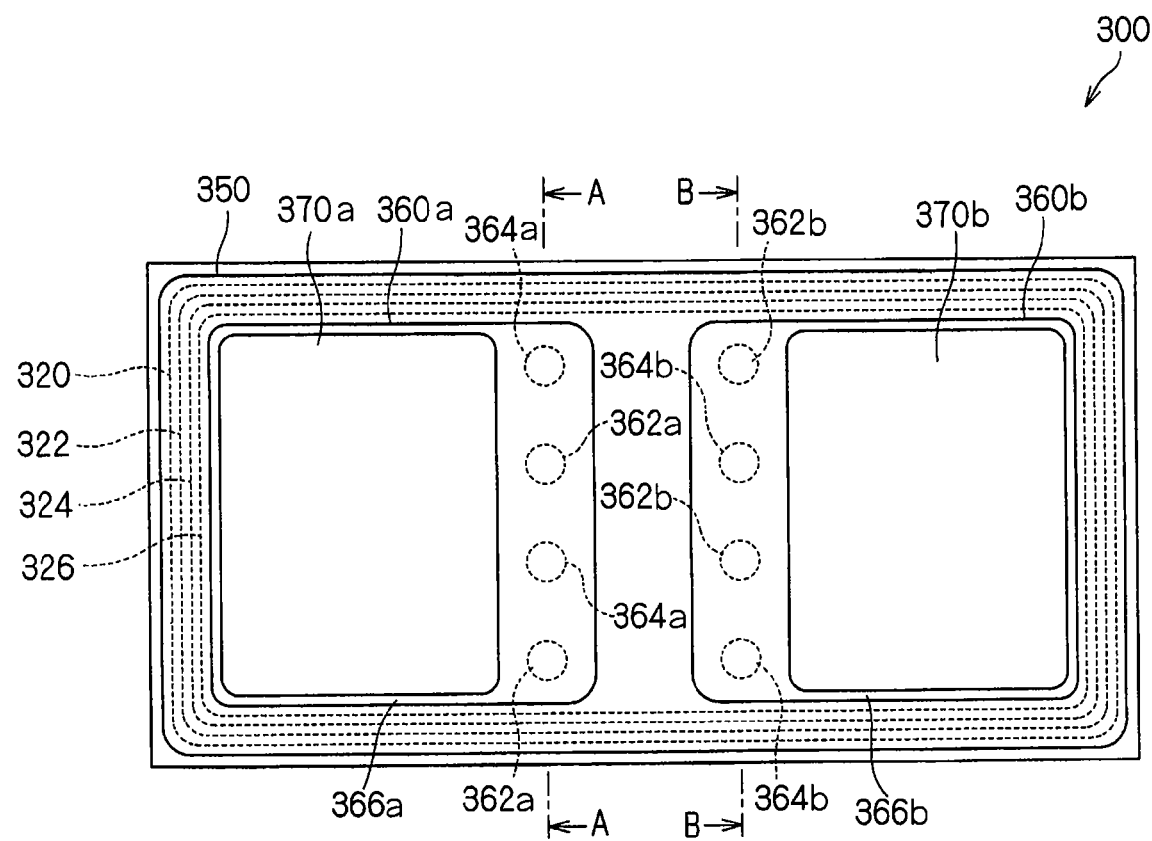
FIG. 17 is a plan view of a thin-film multilayer capacitor according to an eighth embodiment of the present invention.
Figure 18:
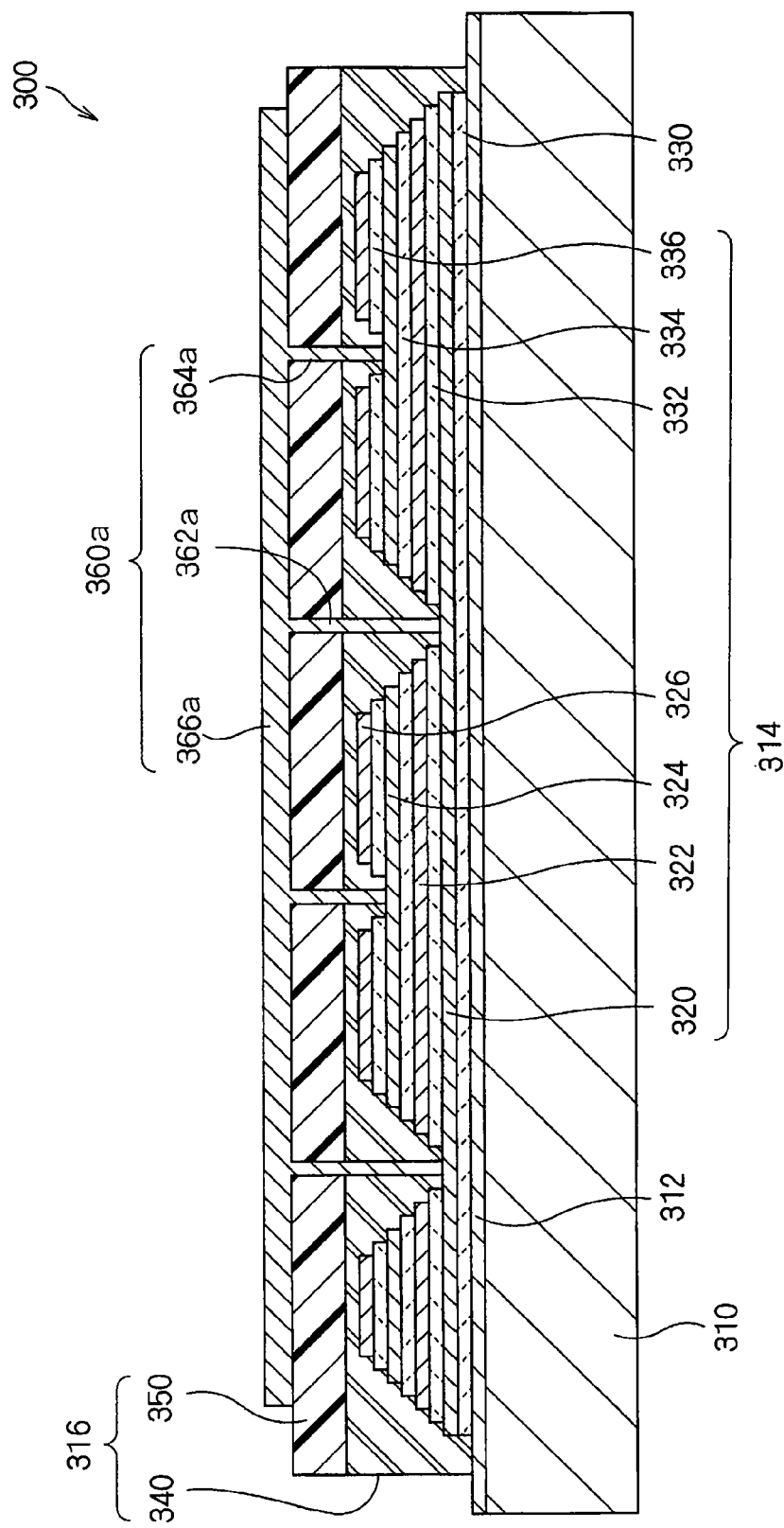
FIG. 18 is a cross-sectional view of the thin-film multilayer capacitor according to the eighth embodiment of the present invention.
Figure 19:
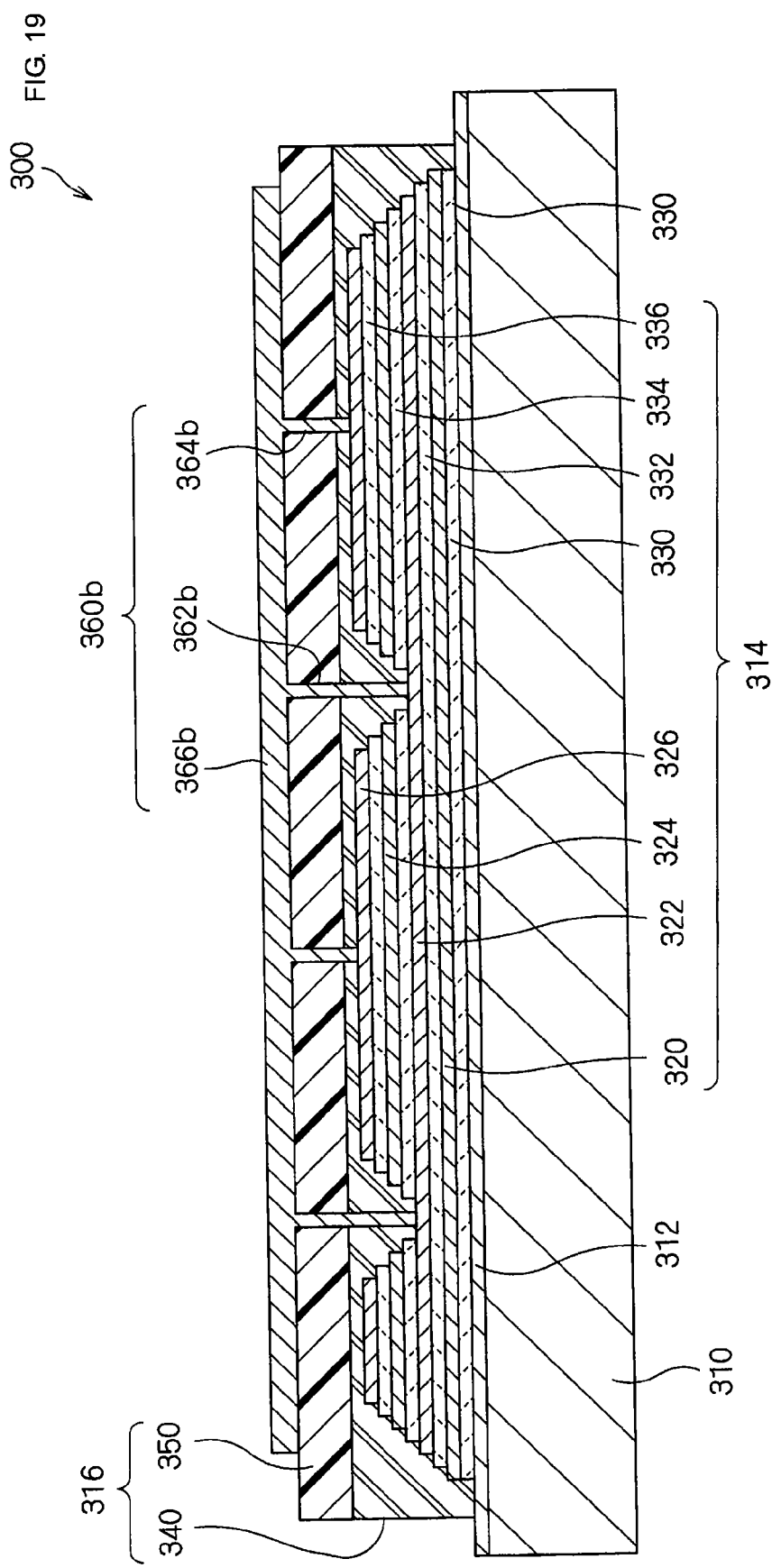
FIG. 19 is a cross-sectional view of the thin-film multilayer capacitor according to the eighth embodiment of the present invention.

A thin-film multilayer capacitor 300 according to an eighth embodiment of the present invention will now be described with reference to FIG. 17 to FIG. 19. FIG. 17 is a plan view of the thin-film multilayer capacitor 300. FIG. 18 is a cross-sectional view taken along line A-A of FIG. 17. FIG. 19 is a cross-sectional view taken along line B-B of FIG. 17.

The thin-film multilayer capacitor 300 includes four BST layers 330, 332, 334, and 336 and four Pt inner electrodes 320, 322, 324, and 326 alternately formed on a thermally-oxidized film 312 of a substrate 310 in a manner similar to that of the seventh embodiment. The thin-film multilayer capacitor 300 further includes a protective layer 316 having a two-layer structure composed of an inorganic insulating layer 340 of silicon nitride and an organic insulating layer 350 of polyimide, lead conductors 360a and 360b, and outer electrodes 370a and 370b.

Of the four BST layers 330, 332, 334, and 336, three layers 332, 334, and 336, each being interposed between adjacent ones of the inner electrodes 320, 322, 324, and 326, serve as dielectric thin films of a capacitor unit 314. The BST layer 330 serves as a contact layer between the thermally-oxidized film 312 and the capacitor unit 314.

As illustrated in FIG. 18, one lead conductor 360a includes connecting parts 362a and 364a connected to the first and third inner electrodes 320 and 324, respectively, and a wiring part 366a disposed on the protective layer 316. As illustrated in FIG. 19, the other lead conductor 360b includes connecting parts 362b and 364b connected to the second and fourth inner electrodes 322 and 326, respectively, and a wiring part 366b disposed on the protective layer 316.

As illustrated in FIG. 17, the connecting parts 362a, 364a, 362b, and 364b each are provided at more than one point. At the same time, the lead conductor 360a is connected to each of the inner electrodes 320 and 324 at a plurality of points, and the lead conductor 360b is connected to each of the inner electrodes 322 and 326 at a plurality of points.

The thin-film multilayer capacitor 300 can be made with a method similar to that for the thin-film capacitor 200 of the seventh embodiment.

In the thin-film multilayer capacitor 300, since the outer electrodes 370a and 370b are formed above the organic insulating layer 350, stress generated during mounting can be absorbed by the organic insulating layer 350. Moreover, since the outer electrode 370a is separated from the connecting parts 362a and 364a of the lead conductor 360a, and the outer electrode 370b is separated from the connecting parts 362b and 364b of the lead conductor 360b, it is possible to prevent separation of the inner electrodes 320, 322, 324, and 326.

Additionally, in the thin-film multilayer capacitor 300 of the present embodiment, current paths in the inner electrodes 320, 322, 324, and 326 are short, and at the same time, the directions of currents flowing in adjacent inner electrodes are substantially opposite in most areas. Therefore, since the resulting magnetic fields cancel each other out, the ESR and ESL of the thin-film multilayer capacitor 300 can be reduced.

Moreover, if the substrate 310 of Si having high fracture toughness is used, the substrate 310 can be grinded and polished to a thickness of several tens of μm.

It is to be understood that the above-described first to eighth embodiments are given for illustrative purposes only and are not intended to limit the scope of the present invention. For example, the process for depositing the dielectric thin film is not limited to a metal-organic decomposition (MOD) process, but may be a sol-gel process, a sputtering process, a chemical vapor deposition (CVD) process, or the like. Also, the material of the dielectric thin film is not limited to BST, but may be lead zirconate titanate (PZT) or the like. Similarly, deposition processes and materials for the upper electrode, lower electrode, contact layer, and the like are not particularly limited, and known deposition processes and materials may be used.

The invention claimed is:

1. A thin-film capacitor comprising:
    a substrate;
    a capacitor unit disposed above the substrate and including an upper electrode layer, a lower electrode layer and a dielectric layer between the upper and lower electrode layers;
    a protective layer covering at least part of the capacitor unit;
    a lead conductor electrically connected to the capacitor unit, the lead conductor including:
        at least one connecting part disposed in a respective opening in the protective layer and electrically connected to the lower electrode layer of the capacitor unit; and
        a wiring part extending over the protective layer; and
    an outer connecting terminal disposed above the lead conductor and entirely outside of an area defined by the respective opening in the protective layer,
    wherein the wiring part has at least one bent portion, and
    wherein the wiring part includes a first conductor line and a second conductor line connected to the first conductor line via the bent portion.

2. The thin-film capacitor according to claim 1, wherein at least one sublayer of the protective layer is an organic insulator.

3. The thin-film capacitor according to claim 1, wherein the wiring part is connected to more than one of the at least one connecting parts.

4. The thin-film capacitor according to claim 1, wherein the capacitor unit is not located directly below the outer connecting terminal.

5. The thin-film capacitor according to claim 1, wherein the first conductor line and the second conductor line are parallel to each other.

6. The thin-film capacitor according to claim 1, wherein the lead conductor is a first lead conductor; and the thin film capacitor further comprises a second lead conductor electrically connected to the upper electrode layer of the capacitor unit, upper electrode layer having a potential different from that of the lower electrode layer, wherein the first lead conductor includes a first connecting part of the at least one connecting part, the first connecting part electrically connected to the lower electrode layer, and the wiring part is a first wiring part extending over the protective layer from the first connecting part in a direction away from the second lead conductor; and the second lead conductor includes a second connecting part electrically connected to the upper electrode layer, and a second wiring part extending over the protective layer from the second connecting part in a direction away from the first lead conductor.

7. The thin-film capacitor according to claim 1, wherein more than one of the at least one connecting parts of the lead conductor are electrically connected to one of the electrode layers of the capacitor unit.

8. A thin-film capacitor comprising:

a substrate;

a capacitor unit disposed above the substrate and including at least one dielectric layer and two electrode layers;

a protective layer covering at least part of the capacitor unit;

a lead conductor electrically connected to one of the electrode layers of the capacitor unit, the lead conductor including:

at least one connecting part disposed in a respective opening in the protective layer and electrically connected to one of the electrode layers of the capacitor unit; and a wiring part extending over the protective layer; and an outer connecting terminal disposed above the lead conductor and entirely outside of an area defined by the respective opening in the protective layer, wherein the two electrode layers of the capacitor unit include an upper electrode layer and a lower electrode layer, and the upper electrode is not directly below the outer connecting terminal, and the protective layer extends an entire width below the outer connecting terminal, wherein the wiring part has at least one bent portion, and wherein the wiring part includes a first conductor line and a second conductor line connected to the first conductor line via the bent portion.

9. The thin-film capacitor according to claim 8, wherein at least one sublayer of the protective layer is an organic insulator.

10. The thin-film capacitor according to claim 8, wherein the wiring part is connected to more than one of the at least one connecting parts.

11. The thin-film capacitor according to claim 8, wherein the capacitor unit is not located directly below the outer connecting terminal.

12. The thin-film capacitor according to claim 8, wherein the first conductor line and the second conductor line are parallel to each other.

13. The thin-film capacitor according to claim 8, wherein the lead conductor is a first lead conductor electrically connected to a first electrode layer of the upper and lower electrode layers of the capacitor unit; and the thin film capacitor further comprises a second lead conductor electrically connected to a second electrode layer of the upper and lower electrode layers of the capacitor unit, the second electrode layer having a potential different from that of the first electrode layer, wherein the first lead conductor includes a first connecting part of the at least one connecting part, the first connecting part electrically connected to the first electrode layer, and the wiring part is a first wiring part extending over the protective layer from the first connecting part in a direction away from the second lead conductor; and the second lead conductor includes a second connecting part electrically connected to the second electrode layer, and a second wiring part extending over the protective layer from the second connecting part in a direction away from the first lead conductor.

14. The thin-film capacitor according to claim 8, wherein more than one of the at least one connecting parts of the lead conductor are electrically connected to one of the electrode layers of the capacitor unit.

* * * * *